(12) United States Patent
Yu et al.

(10) Patent No.: US 9,922,714 B1
(45) Date of Patent: Mar. 20, 2018

(54) TEMPERATURE DEPENDENT ERASE IN NON-VOLATILE STORAGE

(71) Applicant: SanDisk Technologies LLC, Plano, TX (US)

(72) Inventors: Xuehong Yu, San Jose, CA (US); Yingda Dong, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/483,493

(22) Filed: Apr. 10, 2017

(51) Int. Cl.
G11C 11/34 (2006.01)
G11C 16/04 (2006.01)
G11C 16/14 (2006.01)
G11C 16/08 (2006.01)

(52) U.S. Cl.
CPC .......... G11C 16/14 (2013.01); G11C 16/0483 (2013.01); G11C 16/08 (2013.01)

(58) Field of Classification Search
CPC ...... G11C 16/14; G11C 16/08; G11C 16/0483
See application file for complete search history.

(56) References Cited

U.S. PATENT DOCUMENTS

| | | | |
|---|---|---|---|
| 7,583,535 B2 | 9/2009 | Sekar et al. | |
| 8,238,185 B2 | 8/2012 | Lee et al. | |
| 8,542,537 B2 | 9/2013 | Parker | |
| 8,599,622 B2 | 12/2013 | Kim et al. | |
| 8,885,412 B2 | 11/2014 | Li et al. | |
| 8,902,658 B1 | 12/2014 | Raghu et al. | |
| 9,142,304 B2 | 9/2015 | Costa et al. | |
| 9,245,642 B1 | 1/2016 | Chen et al. | |
| 9,257,191 B1* | 2/2016 | Yuan | G11C 11/5635 |
| 2013/0163336 A1* | 6/2013 | Li | G11C 16/0483 365/185.17 |
| 2014/0198575 A1* | 7/2014 | Dutta | G11C 16/3418 365/185.17 |
| 2014/0321211 A1* | 10/2014 | Mu | G11C 16/3445 365/185.19 |
| 2015/0092497 A1* | 4/2015 | Tsai | G11O 5/147 365/185.21 |
| 2017/0345470 A1* | 11/2017 | Pang | G11C 7/14 |

FOREIGN PATENT DOCUMENTS

WO    WO2013/095831 A1    6/2013

\* cited by examiner

*Primary Examiner* — Toan Le
(74) *Attorney, Agent, or Firm* — Vierra Magen Marcus LLP

(57) ABSTRACT

Apparatuses and techniques are described for temperature dependent erase in non-volatile storage. In one aspect, select gate voltage magnitude depends on temperature. This temperature dependent select gate voltage may be applied to a control gate of a select transistor while applying an erase voltage to a bit line and/or source line coupled to the select transistor. This can help assure that there is sufficient GIDL current for efficient erase at lower temperatures. In one aspect, a control circuit increases the duration of the erase voltage that is applied to the source line and/or the bit line at lower temperatures. In one aspect, the magnitude of the first erase voltage in a sequence depends on the present temperature.

20 Claims, 16 Drawing Sheets

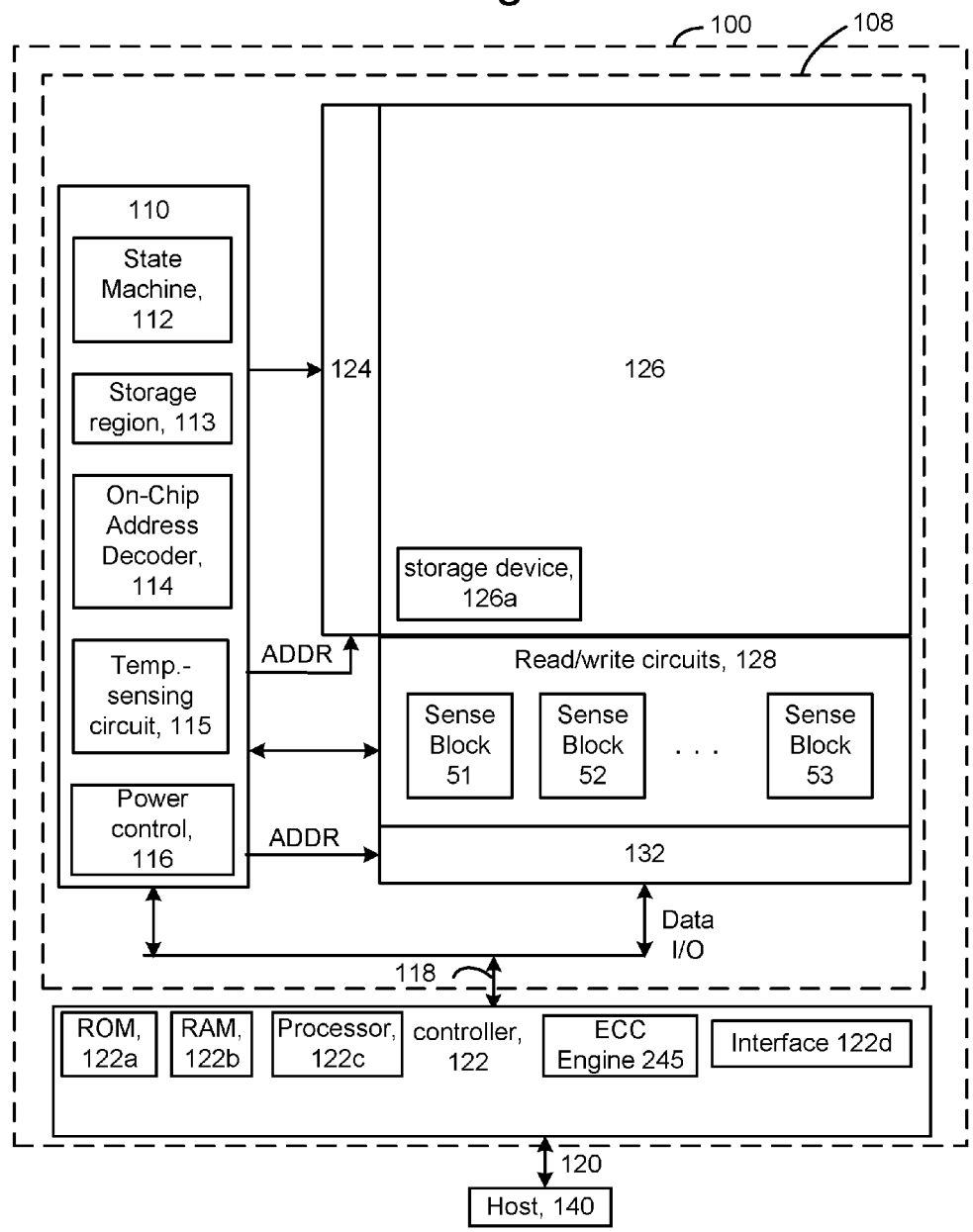

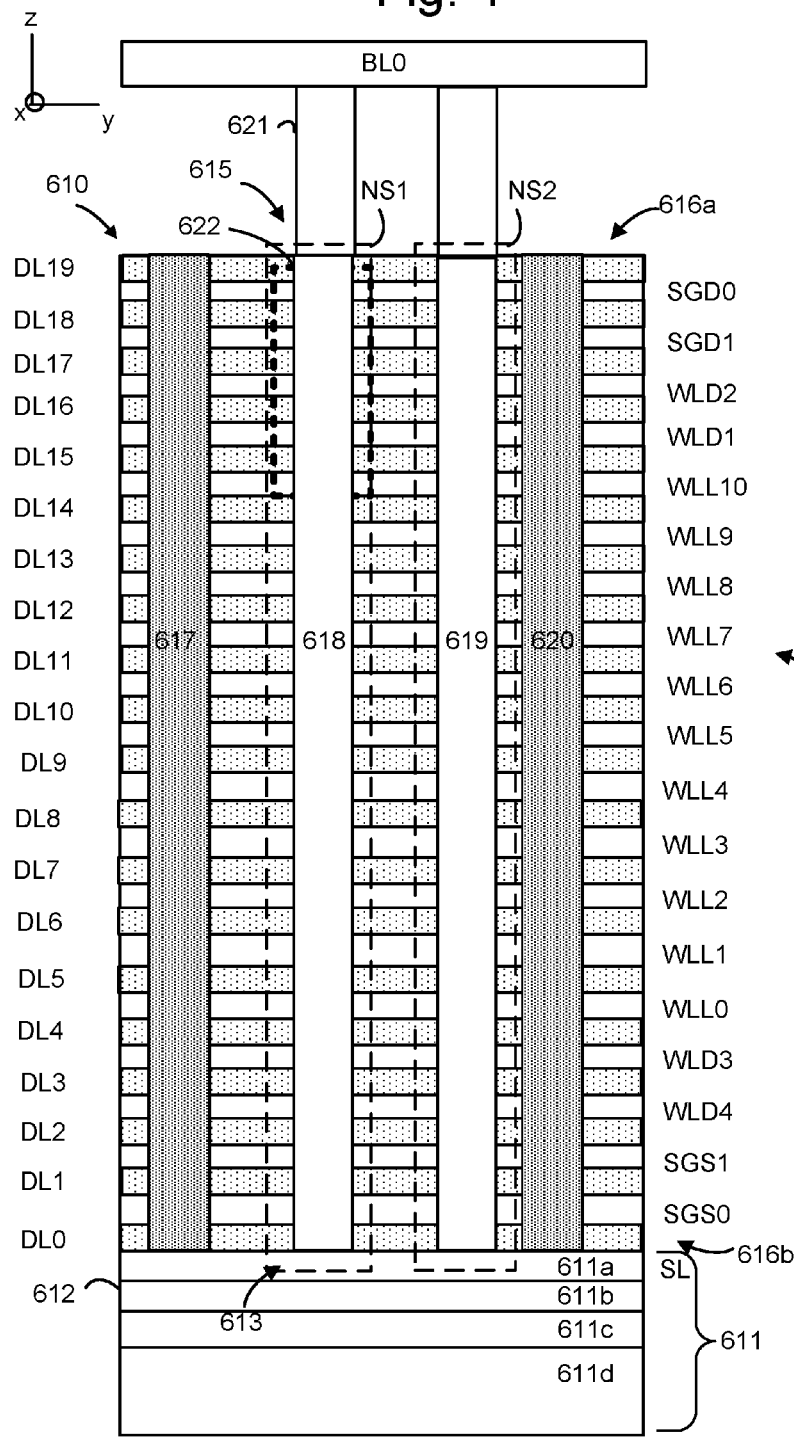
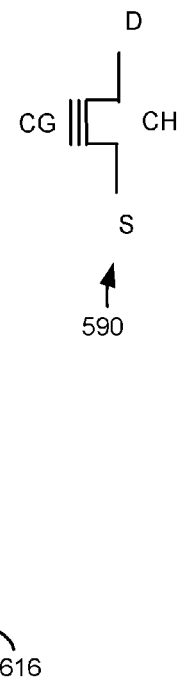

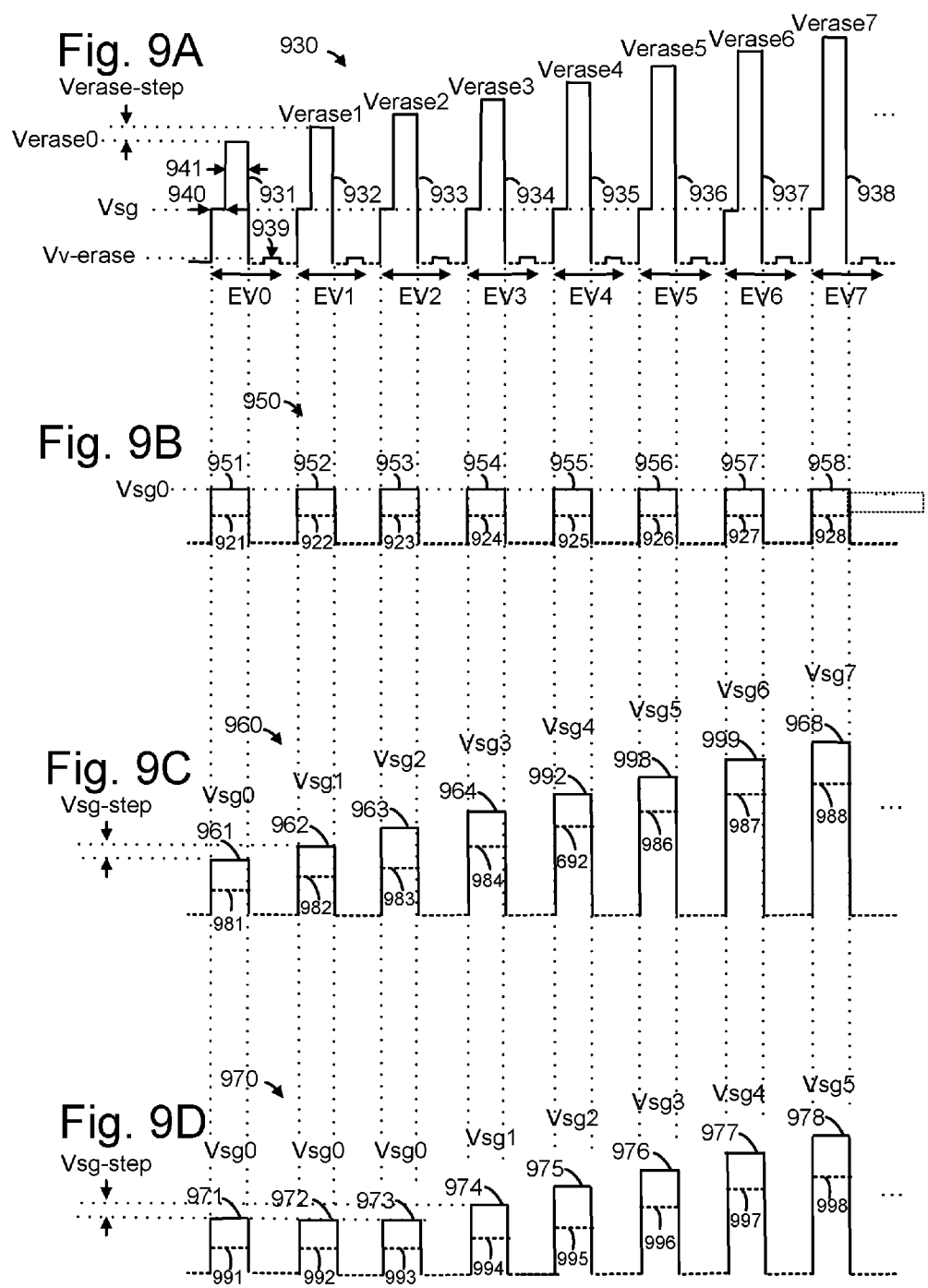

US 9,922,714 B1

TEMPERATURE DEPENDENT ERASE IN NON-VOLATILE STORAGE

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in strings, for instance, where select gate transistors are provided at the ends of the string to selectively connect a channel of the string to a source line or bit line. However, various challenges are presented in operating such memory devices.

BRIEF DESCRIPTION OF THE DRAWINGS

FIG. 1A is a block diagram of an example memory device.

FIG. 4 depicts an example cross-sectional view of a portion of one of the blocks of FIG. 3.

FIG. 5 depicts an example transistor 590.

FIG. 9A depicts a series 930 of erase pulses and verify pulses in an erase operation in accordance with steps 706 and 708 of process 700.

FIG. 9B depicts a series 950 of SGS or SGD select gate voltages for an erase operation in accordance with one embodiment of step 706 of process 700, where a level of the select gate voltages is fixed at Vsg0.

FIG. 9C depicts a series 960 of SGS or SGD select gate voltages for an erase operation in accordance with one embodiment of step 706 of process 700, where a level of the select gate voltages steps up for each erase-verify iteration.

FIG. 9D depicts a series 970 of SGS or SGD select gate voltages for an erase operation in accordance with one embodiment of step 706 of process 700, where a level of the select gate voltages steps up for each iteration after a predetermined or adaptively determined number of erase-verify iterations.

DETAILED DESCRIPTION

Figure 1B:
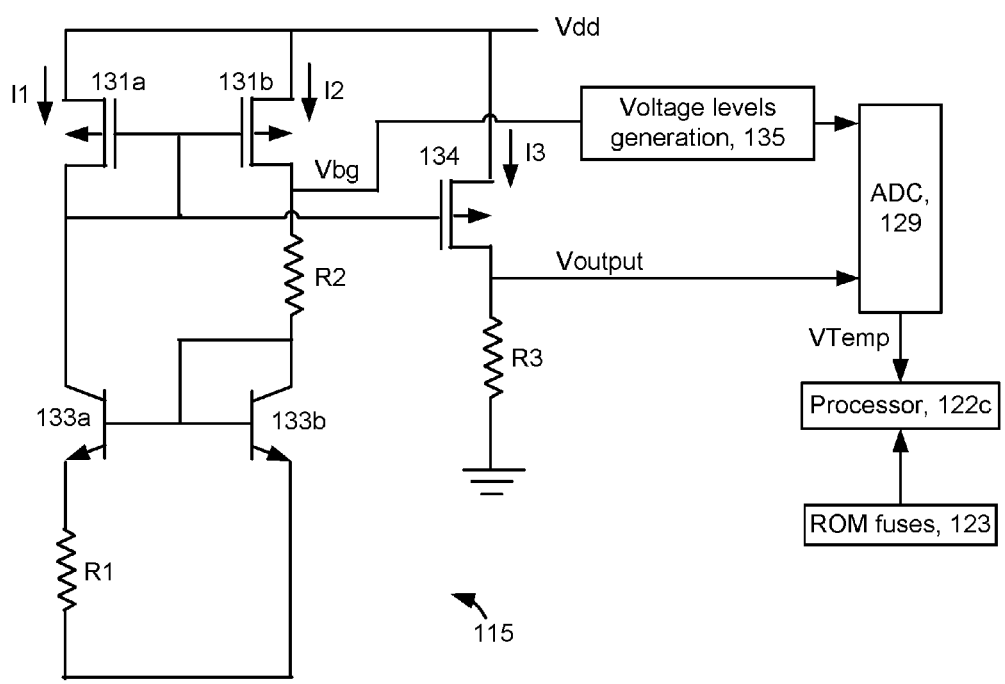
FIG. 1B depicts an example of a temperature-sensing circuit.

Apparatuses and techniques are described for temperature dependent erase in non-volatile storage. Apparatuses and techniques are described for improving erase speed in non-volatile storage at low temperatures.

In some memory devices, memory cells are joined to one another in a string, such as a NAND string. Each NAND string comprises a number of non-volatile storage elements (also referred to herein as non-volatile memory cells) connected in series between one or more drain-side select transistors (SGD transistors) on a drain-side of the NAND string, and one or more source-side select transistors (SGS transistors) on a source-side of the NAND string. Each NAND string has a channel between the drain side and the source side. Each drain-side select transistor is configured to connect/disconnect a NAND string channel to/from a bit line. Each source-side select transistor is configured to connect/disconnect a NAND string channel to/from a source line.

One technique for erasing the non-volatile storage elements is to apply an erase voltage to the source line and a suitable voltage to the source side select gate that charges the NAND channel to approximately the erase voltage. Also, a voltage having a magnitude that is less than the erase voltage (such as ground) may be applied to the word lines. As a result, the non-volatile storage elements may have a relatively high voltage in their channels and a relatively low voltage on their control gates. This combination of voltages may erase the non-volatile storage elements. This is one example of a "one-sided erase."

Another technique for erasing the non-volatile storage elements is to apply an erase voltage to the bit line and a suitable voltage to the drain side select gate that charges the NAND channel to approximately the erase voltage. Also, a voltage having a magnitude that is less than the erase voltage (such as ground) may be applied to the word lines. As a result, the non-volatile storage elements may have a relatively high voltage in their channels and a relatively low voltage on their control gates. This combination of voltages may erase the non-volatile storage elements. This is one example of a "one-sided erase."

It is also possible to perform a "two-sided erase" by combining the source side and drain side one-sided erases. The one-sided and the two-sided erases have in common that a voltage is applied to a conductive element (e.g., source line or bit line) and another voltage is applied to a select gate at the same end of the NAND string as the conductive element.

In one embodiment, the voltage on the select gate, in combination with the voltage on the conductive element generates a gate induced drain leakage (GIDL) current in the select gate. For example, the voltage on the control gate of drain side select transistor in combination with the voltage on the bit line may result in GIDL current. As another example, the voltage on the control gate of source side select transistor in combination with the voltage on the source line may result in GIDL current. Note that GIDL current may occur in a transistor that is in the off state. Also, the GIDL current may result when the select transistor drain voltage is significantly higher than the select transistor control gate voltage. Further note that the GIDL current may result minority carriers. For example, the GIDL current may result in hole generation. During erase, the holes may combine with electrons in charge storage regions of the memory cells to lower the threshold voltage of the memory cells. The erase may be repeated until the memory cells are sufficiently erased. If there is not sufficient GIDL current, then the erase process may be slowed. Thus, the erase operation might be negatively impacted.

The GIDL current may depend on temperature. For example, the GIDL current generation speed may be reduced at lower temperatures. In one embodiment, a control circuit generates a select gate voltage having a magnitude that depends on temperature. This temperature dependent select gate voltage may be applied to the control gate of a select transistor while applying an erase voltage to a conductive element (e.g., bit line and/or source line) coupled to the drain of the select transistor. In one embodiment, the control circuit reduces the magnitude of the select gate voltage at lower temperatures. This can help assure that there is sufficient GIDL current for efficient erase at lower temperatures. For a particular magnitude erase voltage, this may increase the difference between the select gate voltage and the erase voltage, which may assist GIDL current generation. Therefore, erase speed at lower temperatures may be improved.

In one embodiment, a control circuit increases the duration of the erase voltage that is applied to the source line and/or the bit line at lower temperatures. This may also increase erase speed at lower temperatures. In one embodiment, the control circuit combines applying a temperature dependent select gate voltage with a temperature dependent duration of the erase voltage applied to a bit line and/or source line.

For some erase procedures, a sequence of increasing magnitude erase voltages are applied to the bit line and/or source line in different erase loops. In one embodiment, the magnitude of the first erase voltage in a sequence depends on the present temperature. This can help to speed the erase process.

In one embodiment, the control circuit combines a technique in which the duration of the erase voltage that is applied to the source line and/or the bit line depends on temperatures and a technique in which the magnitude of the first erase voltage in the sequence depends on the present temperature. In one embodiment, at lower temperatures, the duration of the erase pulse is increased and the magnitude of the erase voltage in the first erase loop is increased (relative to performing the erase at a higher temperature).

FIG. 1A is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . , 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114 and a power control module 116. The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

In one embodiment, storage region 113 includes a table of select gate voltages. The table may contain a default set of values for normal temperatures, and a special set of values for cold temperatures. The table could include more than two sets of values for the select gate voltages, corresponding to different temperature ranges. The storage region 113 may also contain a table that defines an erase pulse duration, based on temperature (or temperature range). The storage region 113 may also contain a table that defines a magnitude for the first erase pulse in a series that are applied for different erase loops, based on temperature (or temperature range).

The control circuitry 110 may include a temperature-sensing circuit 115 which may be used by the state machine 112 to determine a magnitude to use for a select gate voltage, a duration of an erase voltage, and/or a starting magnitude for an erase voltage in a series of erase voltages. For example, control circuitry 110 may determine whether to decrease a magnitude of a select gate voltage, increase a duration of an erase voltage, and/or increase a starting magnitude for an erase voltage in a series of erase voltages (relative to default values).

The temperature-sensing circuit 115 could be located off the memory die 108, in the controller 122. In this case, processor 112c may determine a magnitude to use for a select gate voltage, a duration of an erase voltage, and/or a starting magnitude for an erase voltage in a series of erase voltages. Thus, processor 112c may determine whether to decrease a magnitude of a select gate voltage, a duration of an erase voltage, and/or a starting magnitude for an erase voltage in a series of erase voltages based on present temperature (relative to default values).

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51, 52, . . . , 53, read/write circuits 128, controller 122, and so forth. The control circuit may also be referred to as a managing circuit.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate). In one embodiment, vertically orientated NAND strings extend perpendicular to the major surface of the substrate.

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 1B depicts an example of a temperature-sensing circuit 115. In this example, the temperature-sensing circuit 115 communicates with the processor 122*c*. The circuit includes pMOSFETs 131*a*, 131*b* and 134, bipolar transistors 133*a* and 133*b* and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor. This is data indicating a temperature of the memory device. ROM fuses 123 store data which correlates the matching voltage level to a temperature, in one approach. The processor then uses the temperature to set temperature-based parameters in the memory device.

Vbg, is obtained by adding the base-emitter voltage (Vbe) across the transistor 131*b* and the voltage drop across the resistor R2. The bipolar transistor 133*a* has a larger area (by a factor N) than the transistor 133*b*. The PMOS transistors 131*a* and 131*b* are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131*a* and 131*b* and the current through the transistor 134 mirrors the current through the transistors 131*a* and 131*b*.

Figure 1C:
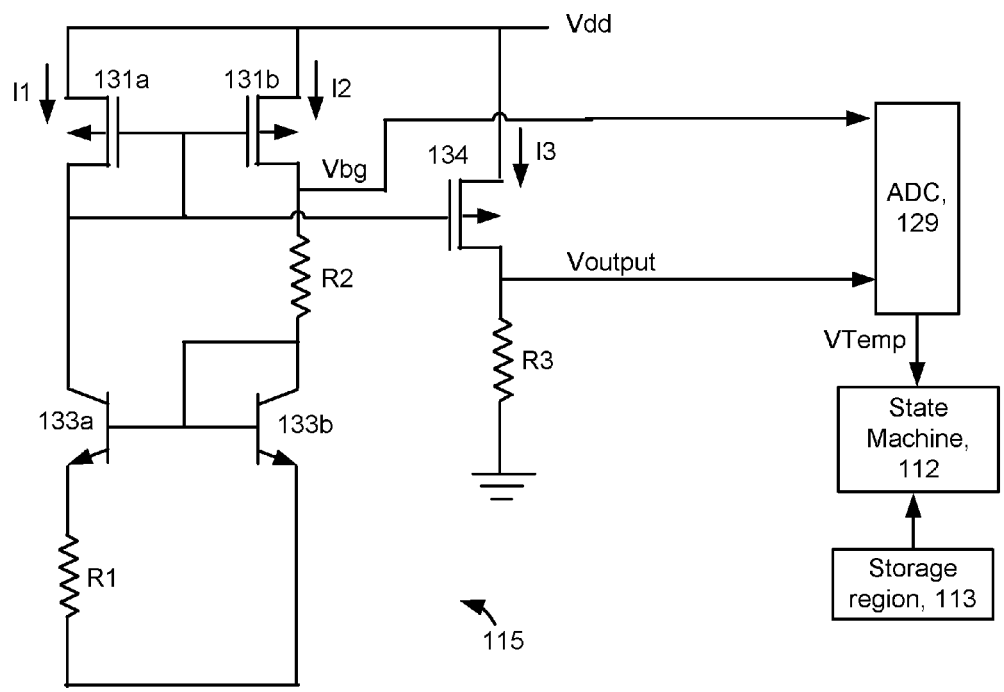
FIG. 1C depicts an example of the temperature-sensing circuit 115 of FIG. 1A

FIG. 1C depicts an example of the temperature-sensing circuit 115 of FIG. 1A. In this example, the temperature-sensing circuit 115 communicates with the state machine 112. The circuit includes pMOSFETs 131*a*, 131*b* and 134, bipolar transistors 133a and 133b and resistors R1, R2 and R3. I1, I2 and I3 denote currents. Voutput is a temperature-based output voltage provided to an analog-to-digital (ADC) converter 129. Vbg is a temperature-independent voltage.

The ADC outputs a digital value (VTemp) to the state machine 112, based on Voutput. This is data indicating a temperature of the memory device. Storage region 113 store tables which correlate voltage levels to a temperature, in one approach. Storage region 113 store tables which correlate erase pulse duration to a temperature, in one approach. Storage region 113 store tables which correlate initial erase pulse magnitude to a temperature, in one approach. The state machine 112 then uses the temperature to set temperature-based parameters in the memory device.

Figure 2:
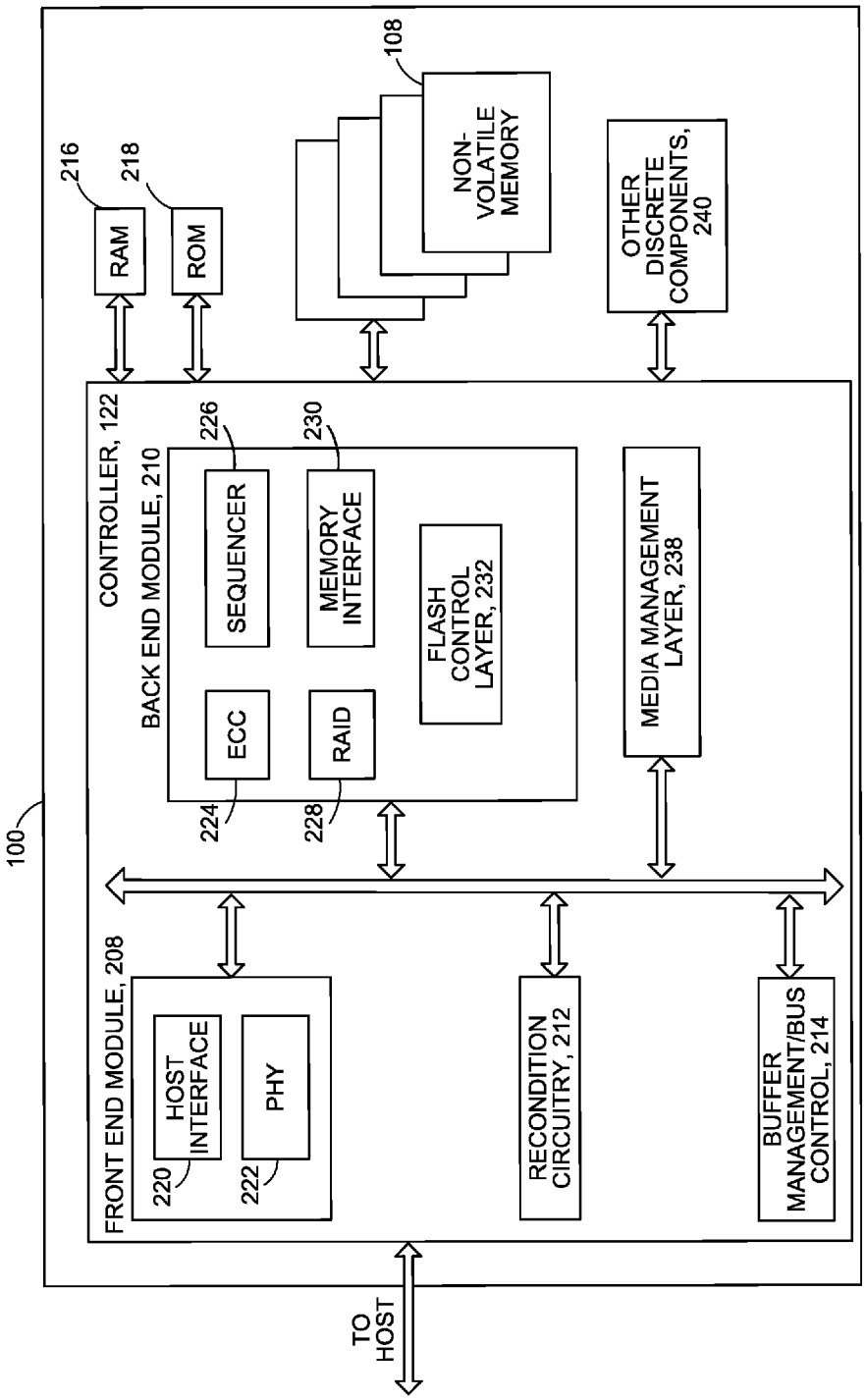
FIG. 2 is a block diagram of the example memory device 100, depicting additional details of the controller 122.

FIG. 2 is a block diagram of the example memory device 100, depicting additional details of the controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 122 and non-volatile memory die 108 may be any suitable flash interface. In one embodiment, memory device 100 may be a card based system, such as a secure digital (SD) or a micro secure digital (micro-SD) card. In an alternate embodiment, the memory system may be part of an embedded memory system. For example, the flash memory may be embedded within the host, such as in the form of a solid state disk (SSD) drive installed in a personal computer.

In some embodiments, the memory device 100 includes a single channel between the controller 122 and the non-volatile memory die 108, the subject matter described herein is not limited to having a single memory channel.

The controller 122 includes a front end module 208 that interfaces with a host, a back end module 210 that interfaces with the one or more non-volatile memory die 108, and various other modules that perform functions which will now be described in detail.

The components of the controller may take the form of a packaged functional hardware unit (e.g., an electrical circuit) designed for use with other components, a portion of a program code (e.g., software or firmware) executable by a processor, e.g., microprocessor, or processing circuitry that usually performs a particular function of related functions, or a self-contained hardware or software component that interfaces with a larger system, for example. For example, each module may include an Application Specific Integrated Circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for the controller to perform the functions described herein. The architecture depicted in FIG. 2 is one example implementation that may (or may not) use the components of the controller 122 depicted in FIG. 1A (e.g., RAM, ROM, processor, interface).

The controller 122 may include recondition circuitry 212, which is used for reconditioning memory cells or blocks of memory. The reconditioning may include refreshing data in its current location or reprogramming data into a new word line or block as part of performing erratic word line maintenance, as described below.

Referring again to modules of the controller 122, a buffer manager/bus controller 214 manages buffers in random access memory (RAM) 216 and controls the internal bus arbitration of Controller 122. The RAM may include DRAM and/or SRAM. DRAM or Dynamic Random Access Memory is a type of semiconductor memory in which the memory is stored in the form of a charge. Each memory cell in a DRAM is made of a transistor and a capacitor. The data is stored in the capacitor. Capacitors loose charge due to leakage and hence DRAMs are volatile devices. To keep the data in the memory, the device must be regularly refreshed. In contrast, SRAM or Static Random Access Memory will retain a value as long as power is supplied.

A read only memory (ROM) 218 stores system boot code. Although illustrated in FIG. 2 as being located separately from the controller, in other embodiments, one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction controller (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the memory device 100. In some cases, the RAID module 228 may be a part of the ECC engine 224. Note that the RAID parity may be added as an extra die or dies as implied by the common name, but it may also be added within the existing die, e.g. as an extra plane, or extra block, or extra word lines within a block. A memory interface 230 provides the command sequences to non-volatile memory die 108 and receives status information from the non-volatile memory die. A flash control layer 232 controls the overall operation of back end module 210.

Additional components of memory device 100 include media management layer 238, which performs wear leveling of memory cells of non-volatile memory die 108. The memory system also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus controller 214 are optional components that are not necessary in the Controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the memory structure 126, e.g., flash memory, of die 108. The MML 238 may be needed because: 1) the flash memory may have limited endurance; 2) the flash memory may only be written in multiples of pages; and/or 3) the flash memory may not be written unless it is erased as a block. The MML 238 understands these potential limitations of the flash memory which may not be visible to the host. Accordingly, the MML 238 attempts to translate the writes from host into writes into the flash memory. Erratic bits may be identified and recorded using the MML 238. This recording of erratic bits can be used for evaluating the health of blocks and/or word lines (the memory cells on the word lines).

The controller 122 may interface with one or more memory dies 108. In one embodiment, the controller and multiple memory dies (together comprising the memory device 100) implement a solid state drive (SSD), which can emulate, replace or be used instead of a hard disk drive inside a host, as a network-attached storage (NAS) device, and so forth. Additionally, the SSD need not be made to work as a hard drive.

Figure 3:
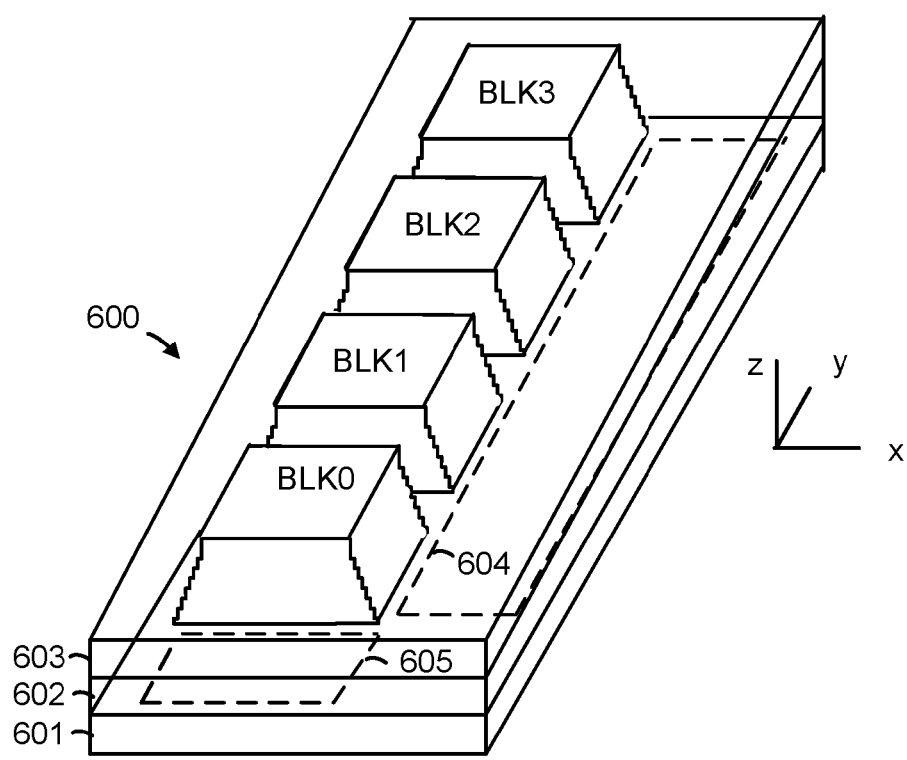
FIG. 3 is a perspective view of a memory device 600 comprising a set of blocks in an example 3D configuration of the memory structure 126 of FIG. 1A.

FIG. 3 is a perspective view of a memory device 600 comprising a set of blocks in an example 3D configuration of the memory structure 126 of FIG. 1A. On the substrate are example blocks BLK0, BLK1, BLK2 and BLK3 of memory cells (storage elements) and peripheral areas with circuitry for use by the blocks. The substrate has a major surface that extends in the x-y plane. The blocks may be formed over the major surface. The peripheral area 604 runs along an edge of each block while the peripheral area 605 is at an end of the set of blocks. Each peripheral area can include circuitry, including but not limited to voltage drivers which can be connected to control gate layers, bit lines and source lines of the blocks.

The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

FIG. 4 depicts an example cross-sectional view of a portion of one of the blocks of FIG. 3. The block comprises a stack 610 of alternating conductive and dielectric layers. In this example, the conductive layers comprise two SGD layers (SGD0, SGD1), two SGS layers (SGS0, SGS1) and four dummy word line layers (or word lines) WLD1, WLD2, WLD3 and WLD4, in addition to data word line layers (or word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6. Note that there may be more or fewer SGD layers, SGS layers, dummy word line layers, and data word line layers.

The stack includes a substrate 611. In one approach, a portion of the source line SL comprises an n-type source diffusion layer 611a in the substrate which is in contact with a source end of each string of memory cells in a block. The n-type source diffusion layer 611a is formed in a p-type well region 611b, which in turn is formed in an n-type well region 611c, which in turn is formed in a p-type semiconductor substrate 611d, in one embodiment. The n-type source diffusion layer 611a may be shared by all of the blocks in a plane, in one approach.

NS1 has a source-end 613 at a bottom 616b of the stack 616 and a drain-end 615 at a top 616a of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage sources.

FIG. 5 depicts an example transistor 590. The transistor comprises a control gate CG, a drain D, a source S and a channel CH. The control gate may also be referred to as a control terminal. The drain and source may also be referred to as terminals of the transistor. Note that which physical terminals of the transistor functions as the source and drain may depend on the voltages that are applied to the transistor. The transistor may be part of a select gate or a memory cell. In the case that the transistor is part of a select gate, the drain may be biased to a significantly higher voltage than the control gate during a portion of an erase procedure, which may result in a GIDL current. For example, the drain may be biased to an erase voltage, while the control gate is biased to a select gate voltage. In some embodiments, the magnitude of the control gate voltage depends on the present temperature. The GIDL current may help to pass the drain voltage (e.g., erase voltage) to the channel of the NAND string, such that the channel of the memory cells may be at the erase voltage.

In the case of a memory cell transistor, the control gate voltage can be set to a low value during erase such as 0 V so that the channel-to-control gate voltage results in a significant electrical field. In one embodiment, holes in the channel combine with electrons in the charge trapping region of memory cells to lower the Vth of the memory cell. In the case of a select gate transistor, the control gate voltage can be set to a higher value such as 10 V so that the channel-to-control gate voltage is not high enough to lower the Vth of the transistor.

Figure 6:
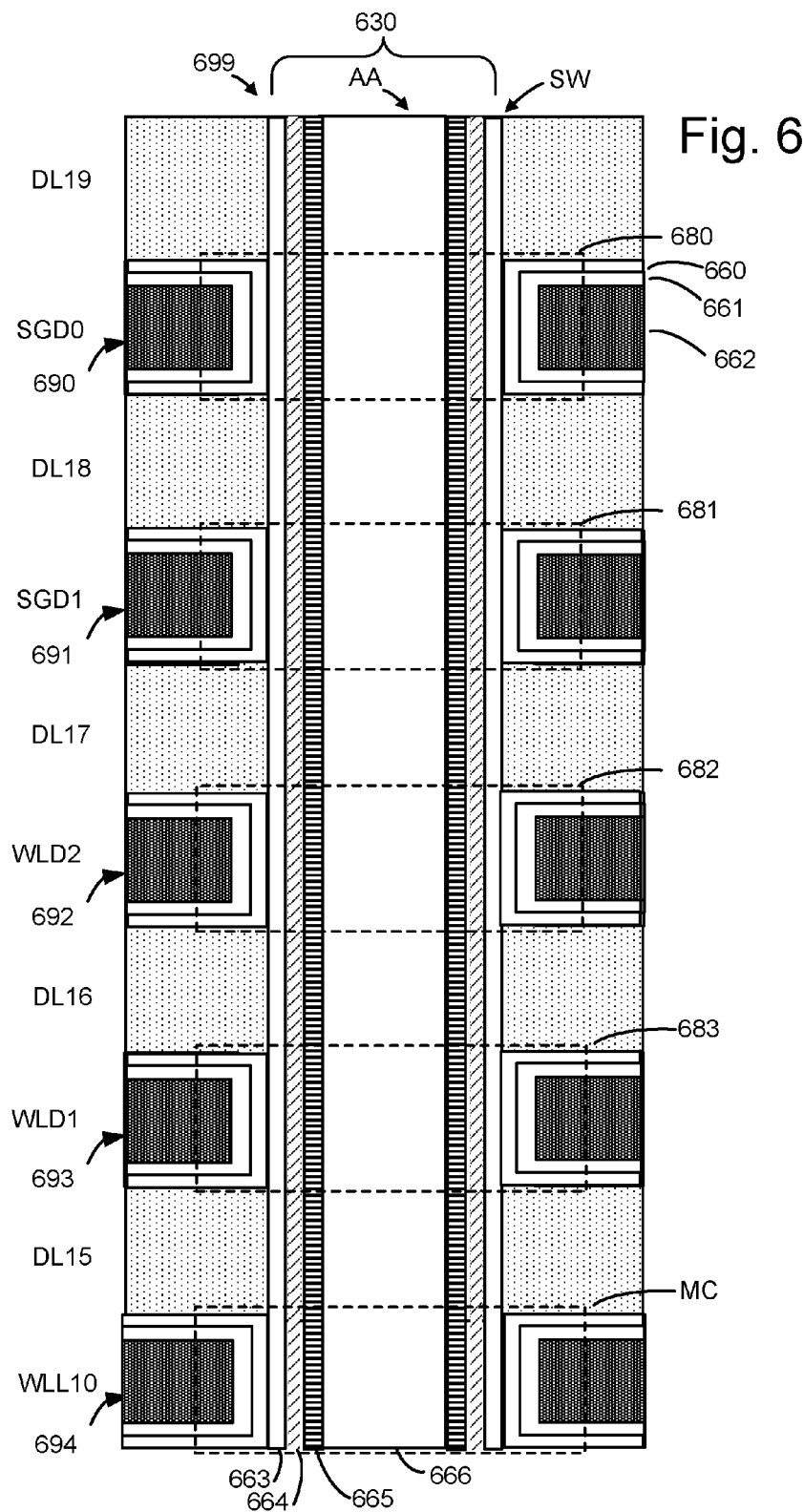
FIG. 6 depicts a close-up view of the region 622 of the stack of FIG. 4.

FIG. 6 depicts a close-up view of the region 622 of the stack of FIG. 4. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each pillar 699 or column which is formed by the materials within a memory hole can include a charge-trapping layer 663 or film such as silicon nitride ($Si_3N_4$) or other nitride, a tunneling layer 664, a channel 665 (e.g., comprising polysilicon), and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 7:
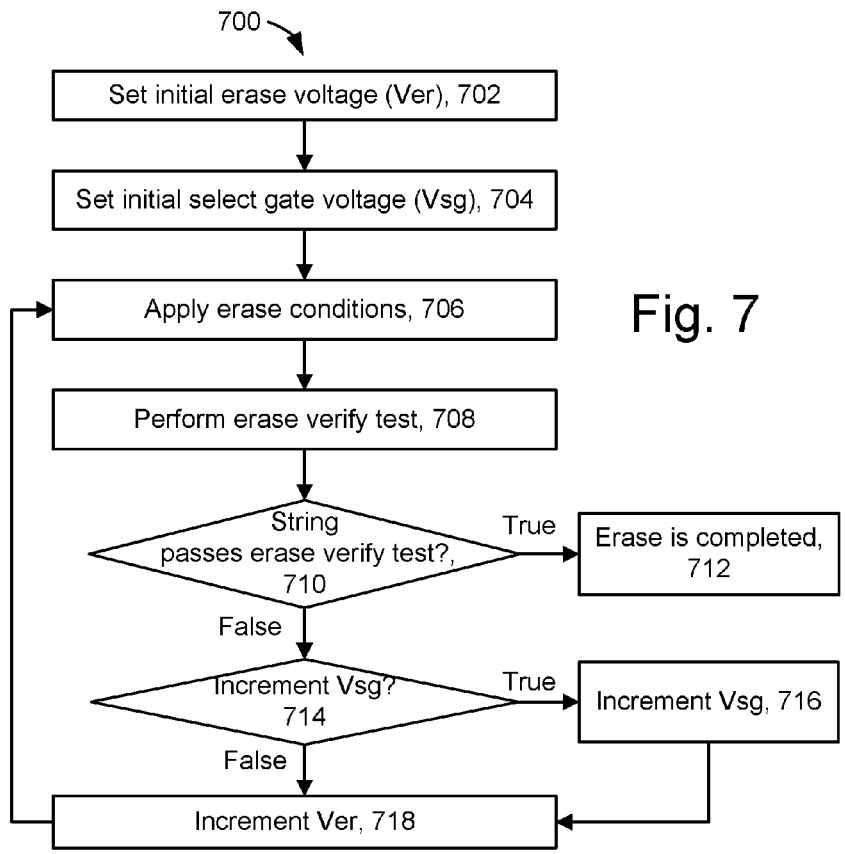
FIG. 7 depicts one embodiment of a process 700 for performing an erase operation.

FIG. 7 depicts one embodiment of a process 700 for performing an erase operation. Process 700 is described with respect to a string of memory cells. The string includes a select gate on at least one end of the string. For example, the select gate may be a drain side select gate, which has one of its terminals (e.g., drain) coupled to a bit line. As another example, the select gate may be a source side select gate, which has one of its terminals coupled to a source line. In one embodiment, this is a NAND string of memory cells. The process 700 may be performed in parallel on many strings.

Step 702 sets a magnitude of an initial erase voltage (Ver). In one embodiment, the magnitude of the initial erase voltage depends on the temperature. In one embodiment, process 700 performs a single sided erase on the bit line side. Thus, the initial erase voltage is for a bit line voltage, in one embodiment. In one embodiment, process 700 performs a single sided erase on the source line side. Thus, the initial erase voltage is for a source line voltage, in one embodiment. In one embodiment, process 700 performs a two-sided erase on the source line side and the bit line side. Thus, step 702 may include setting a magnitude of an initial erase voltage for the bit line and magnitude of an initial erase voltage for the source line. In one embodiment, the erase voltage has the same magnitude on the bit line and the source line.

Step 704 sets a magnitude of an initial select gate voltage (Vsg). In one embodiment, the magnitude of the initial select gate voltage depends on the temperature. In one single sided erase embodiment, step 704 includes setting an initial magnitude of a drain side select gate voltage, based on temperature. In one single sided erase embodiment, step 704 includes setting an initial magnitude of a source side select gate voltage, based on temperature. In one two-sided erase embodiment, step 704 includes setting an initial magnitude of a drain side select gate voltage and setting an initial magnitude of a source side select gate voltage, based on temperature.

Step 706 includes applying erase conditions. Step 706 may include applying suitable voltages to a bit line, a source line, control gate(s) of drain side select transistor(s), control gate(s) of source side select transistor(s), and control gates of memory cells.

Step 706 may include charging up (e.g., increasing the voltage of) a channel of the memory string from the source and/or the drain end, and setting a low voltage such as 0 V on the word lines (control gates) of the memory cells. In one embodiment, charging up the channels includes applying a suitable voltage to the drain side and/or the source side select gates to generate GIDL current.

Step 708 includes performing an erase verify test for a string. Typically, this involves setting an erase verify voltage VvEr to the word lines that are connected to control gates of memory cells on the string while sensing a current in the memory string. If the current is sufficiently high, the string is considered to pass the verify test. If the string passes the erase verify test at decision step 710, the erase operation is completed, at step 712. If the string does not pass the erase verify test at decision step 710, the process 700 continues at step 714.

Step 714 includes a determination of whether the select gate voltage is to be incremented. If so, then the select gate voltage is incremented in step 716. Whether or not the select gate voltage is incremented, the erase voltage is incremented in step 718. Then, the next iteration of the erase procedure is performed by returning to step 706. An erase iteration (or loop) typically involves applying erase conditions followed by performing a verify test, although in some cases the verify test is omitted.

Figure 8:
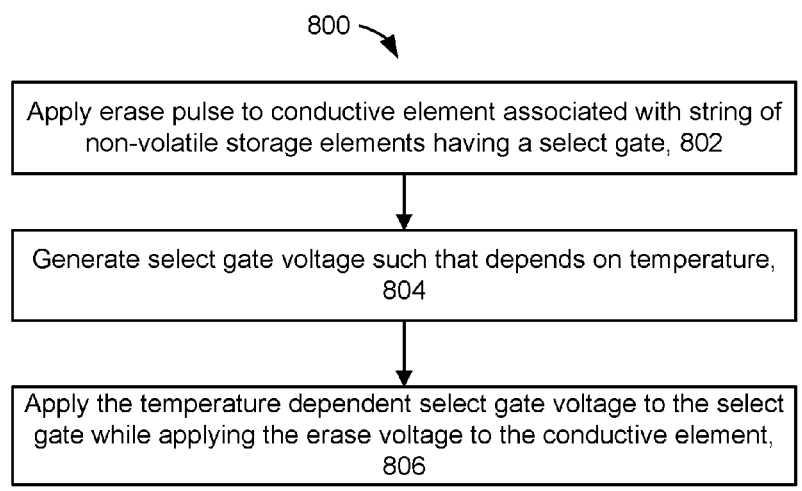
FIG. 8 is a flowchart of one embodiment of a process 800 of applying erase conditions.

FIG. 8 is a flowchart of one embodiment of a process 800 of applying erase conditions to a string of memory cells. The string of memory cells is associated with a conductive element such as a bit line or source line. The string of memory cells has a select gate adjacent to the conductive element. For example, the string of memory cells may have a drain side select gate at the same end of a NAND string as a bit line and/or a source side select gate at the same end of the NAND string as a source line. The process 800 may be used in step 706 of process 700. Thus, process 800 may be applied more than once during process 700.

In one embodiment, process 800 is performed by a control circuit. In one embodiment, process 800 is performed on a NAND string of memory cells. The string of memory cells is a NAND string in a three-dimensional memory array, in one embodiment. The string is a vertically oriented NAND string in a three-dimensional memory array, in one embodiment. Note that the steps of process 800 are not necessarily performed in the depicted order.

Step 802 includes applying an erase pulse to the conductive element associated with the string of memory cells. The conductive element is coupled to a terminal (e.g., drain) of the select gate, in one embodiment. In one embodiment, the erase pulse is applied to a bit line and the select gate is a drain side select gate. In one embodiment, the erase pulse is applied to a source line and the select gate is a source side select gate. In one embodiment, a first erase pulse is applied to a bit line and a second erase pulse is applied to a source line, in step 802.

Step 804 includes generating a select gate voltage that has a magnitude that depends on temperature. In one embodiment, the magnitude of the select gate voltage is directly related to the temperature. By "directly related" is it meant that as the temperature decreases, the magnitude of the select gate voltage decreases, for at least two different temperatures. At a minimum, the select gate voltage has two different magnitudes for a corresponding two different temperatures. However, note that the magnitude of the select gate voltage may be the same within one or more temperature ranges, and still be considered to be directly related to temperature, so long as the select gate voltage has two different magnitudes for two different temperatures.

Step 804 may be performed by a control circuit in a non-volatile memory system 100. In one embodiment, the control circuit is configured to cause the magnitude of the select gate voltage to be lower in response to lower temperatures. In one embodiment, the control circuit is configured to increase the difference between the magnitude of the erase voltage and the magnitude of the select gate voltage in response to lower temperatures. In one embodiment, for a particular magnitude erase voltage the control circuit is configured to generate the select gate voltage having a first voltage in response to the temperature being below a threshold temperature and a second voltage in response to the temperature being above the threshold temperature, wherein the first voltage is less than the second voltage.

Step 806 includes applying the temperature dependent select gate voltage to the select gate while applying the erase pulse to the conductive element. Note that the control circuit may apply other conditions at this time, such as a suitable voltage to control gates of memory cells. Step 806 may result in a GIDL current being generated. In one embodiment, the magnitude of the temperature dependent select gate is significantly lower than the magnitude of the erase pulse in order to generate adequate GIDL current.

GIDL current at a select gate may be determined by the bias difference (Vdg=Vd−Vgs), between the drain voltage (Vd) and the gate voltage (Vgs) of the select gate. Note that Vd may be equal to the erase voltage applied to the bit line or source line. The GIDL current density can be modeled by: $J=A*Es*exp(-B/Es)$, where Es is the transverse electric field at the surface, and $Es=(Vdg+C)/Tox$. Thus, $J=A'*(Vdg+C)*exp(-B'/(Vdg+C))$, where A', B' and C are constants determined by some physical parameters. Normally, Vdg>>Vth of the select gate to obtain a considerable GIDL current. In one configuration, Vdg>5 V is needed to generate enough GIDL for an erase pulse width of about one msec. When Vdg is small, GIDL may be negligible and might not able to charge-up the channel to cause erase. Note that at colder temperatures it may be more difficult to generate adequate GIDL current.

Figure 11A:
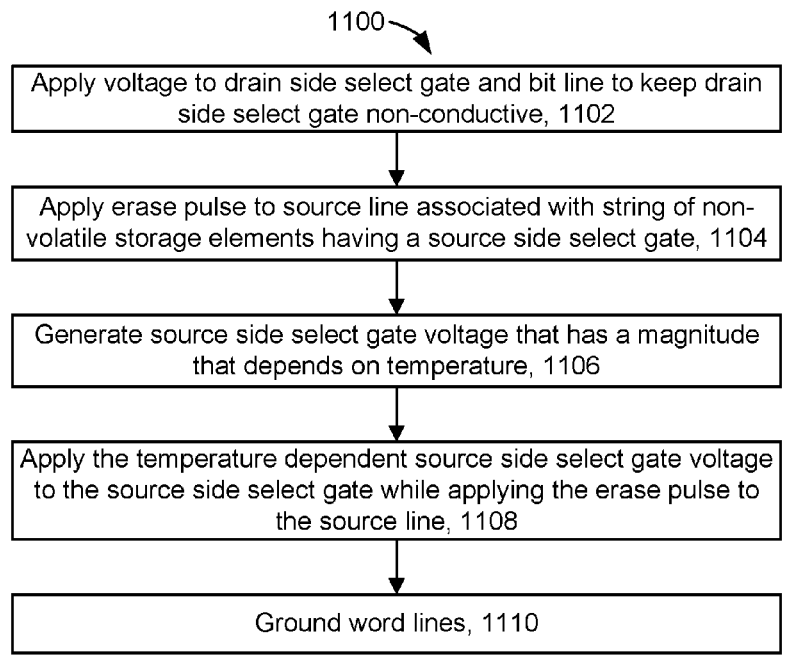
FIG. 11A is a flowchart of one embodiment of a process 1100 of applying erase conditions in a one-sided erase from a source side.
Figure 11B:
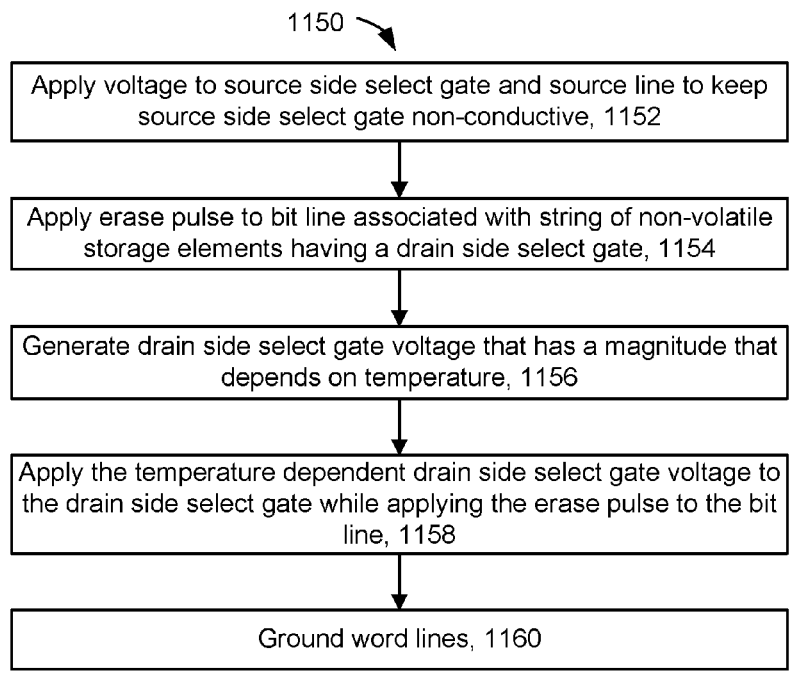
FIG. 11B is a flowchart of one embodiment of a process 1150 of applying erase conditions in a one-sided erase from a drain side.
Figure 11C:
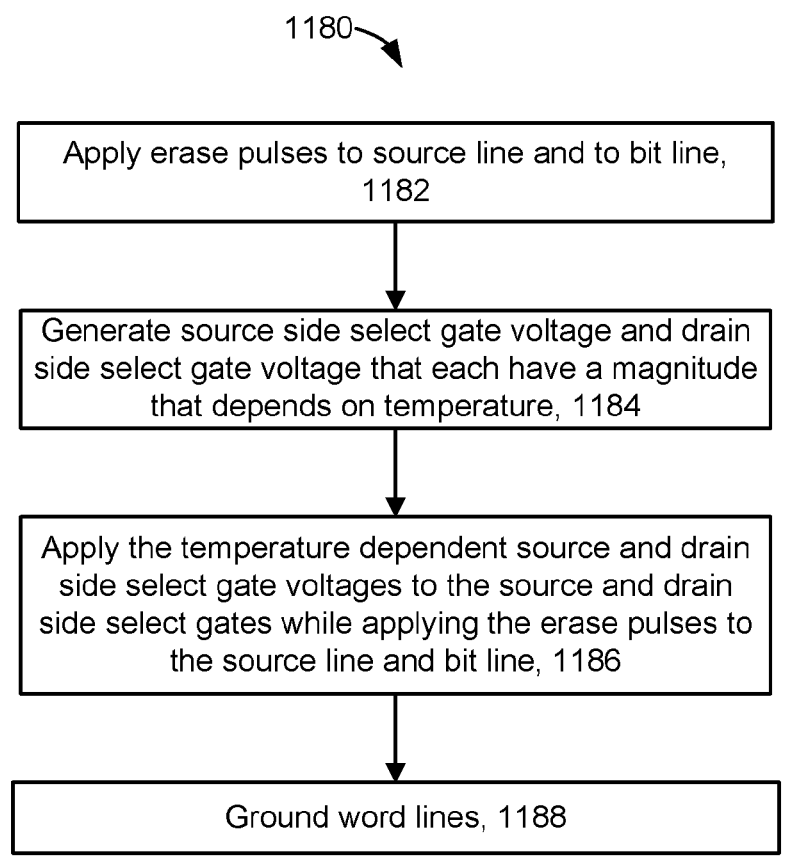
FIG. 11C is a flowchart of one embodiment of a process 1100 of applying erase conditions in a two-sided erase.

Step 806 may result in the channel of the string being charged to, for example, approximately the magnitude of the erase pulse. FIGS. 11A-11C provide further details for various embodiments.

FIGS. 9A-9D shows sequences of erase pulses and sequences of select gate voltages that may be used during process 700. When performing process 800, one of the erase pulses in the sequence and a corresponding select gate voltage may be applied.

FIG. 9A depicts a series 930 of erase pulses and verify pulses in an erase operation in accordance with steps 706 and 708 of process 700. The erase pulses and verify pulses are presented together for understanding although they are applied to different portions of the memory device (the bit lines and/or source lines for the erase pulse, and control gates for verify pulses). An erase operation can include multiple erase-verify iterations, which are represented by EV0 to EV7. Each erase-verify iteration can include an erase portion/pulse followed by a verify portion. Examples erase portions 931-938 are provided for erase-verify iterations EV0-EV7, respectively. Example verify portion 939 having an amplitude of Vv-erase follows erase portion 931. In the erase portion, an erase pulse or voltage is applied to one or both ends of a NAND string. For example, an erase pulse or voltage is applied to a bit line and/or a source line associated with the NAND string. Each erase portion can have a first portion which is applied in a preparation phase, and a second portion which is applied in charge up and erase phases. For example, erase portion 931 has a first portion 940 and a second portion 941. In this example, the first portion of each erase portion has an amplitude of Vsg (an initial lower level), and the second portions of the erase portions have amplitudes (subsequent peak levels) of Verase0 to Verase7, which increase according to a step size of Verase-step. In some embodiments, the first portion 940 is stepped up one or more times from one erase pulse to the next.

The erase pulses can thus step up in amplitude in each iteration, in one approach, by Verase-step. In one embodiment, the magnitude for Vrease7 is 20 Volts. Verase-step can be fixed or varying in an erase operation. In the verify portion, a determination is made as to whether the Vth of a selected memory cell which is to be erased has fallen below Vv-erase. This can include determining whether the selected memory cell is in a conductive state when a word line voltage of Vv-erase is applied to the selected memory cell. If the selected memory cell is in a conductive state, Vth<Vv-erase and the selected memory cell has been erased. If the selected memory cell is in a non-conductive state, Vth>Vv-erase and the selected memory cell has not yet been erased.

FIG. 9B depicts a series 950 of SGS or SGD select gate voltages for an erase operation in accordance with one embodiment of step 706 of process 700, where a level of the select gate voltages is fixed at Vsg0 (but note that Vsg0 depends on temperature). The series 950 includes a set of first levels 951-958 and a set of second levels 921-928. The magnitude of the select gate voltage depends on temperature, in the embodiment of FIG. 9B. Select gate voltages 951-958 may be for a first temperature, and select gate voltages 921-928 may be for a second temperature. In one embodiment, the second temperature is lower than the first temperature. In one embodiment, the set of first levels 951-958 is used when the temperature is above a threshold temperature, and the set of second levels 921-928 is used when the temperature is at or below the threshold temperature.

In one embodiment, the set of first levels 951-958 correspond to normal operating temperatures, and the set of second levels 921-928 correspond to cold operating temperatures. A cold operating temperature is defined as one that is below some temperature threshold. In one embodiment, the magnitude for Vsg0 for the set of first levels 951-958 (e.g., for normal operating temperatures) is about 8V when the select gate is the source side and about 9V when the select gate is the drain side. In one embodiment, the magnitude for Vsg0 for the set of first levels 921-928 (e.g., for cold operating temperatures) is about 4V when the select gate is the source side and about 4V when the select gate is the drain side.

FIG. 9C depicts a series 960 of SGS or SGD select gate voltages for an erase operation in accordance with one embodiment of step 706 of process 700, where a level of the select gate voltages steps up for each erase-verify iteration. For example, the select gate voltages are Vsg0-Vsg7, respectively. In one approach, the step size Vsg-step is the same as Verase-step, so that the drain-to-gate voltage of the select gate is constant in the different erase-verify iterations. By stepping up the select gate voltage with the erase voltage, increasingly higher drain-to-gate voltage differences across the select gates are avoided.

The series 960 includes a set of first levels 961-968 and a set of second levels 981-988. The magnitude of the select gate voltage depends on temperature, in the embodiment of FIG. 9C. Select gate voltages 961-968 are for a first temperature, and select gate voltages 981-988 are for a second temperature. In one embodiment, the second temperature is lower than the first temperature. In one embodiment, the set of first levels 961-968 is used when the temperature is above a threshold temperature, and the set of second levels 981-988 is used when the temperature is at or below the threshold temperature.

FIG. 9D depicts a series 970 of SGS or SGD select gate voltages for an erase operation in accordance with one embodiment of step 706 of process 700, where a level of the select gate voltages steps up for each iteration after a predetermined or adaptively determined number of erase-verify iterations. In this example, the select gate voltages are at Vsg0 for three erase loops, and are at stepped up levels Vsg1-Vsg5, respectively, according to the step size Vsg-step.

The series 970 includes a set of first levels 971-978 and a set of second levels 991-998. The magnitude of the select gate voltage depends on temperature, in the embodiment of FIG. 9D. Select gate voltages 971-978 are for a first temperature, and select gate voltages 991-998 are for a second temperature. In one embodiment, the second temperature is lower than the first temperature. In one embodiment, the set of first levels 971-978 is used when the temperature is above a threshold temperature, and the set of second levels 991-998 is used when the temperature is at or below the threshold temperature.

Although the examples in FIGS. 9B-9D depict only two sets of voltage levels for the voltage to the select gate (Vsg), there may be more than two different sets of voltage levels for the select gate.

Figure 10A:
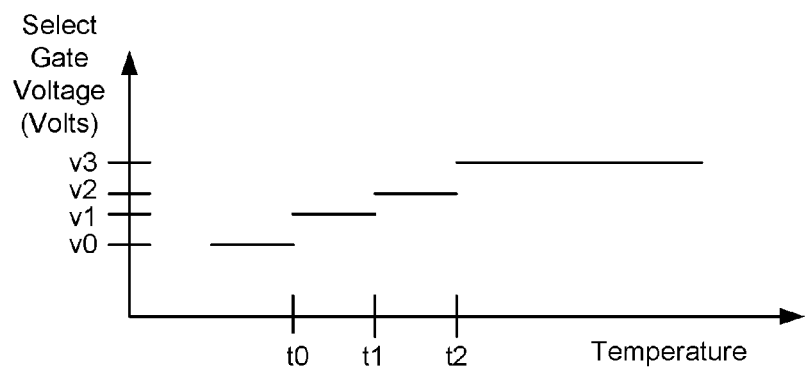
FIGS. 10A-10C shows various examples in which the magnitude of the voltage applied to the select gate depends on temperature.
Figure 10B:
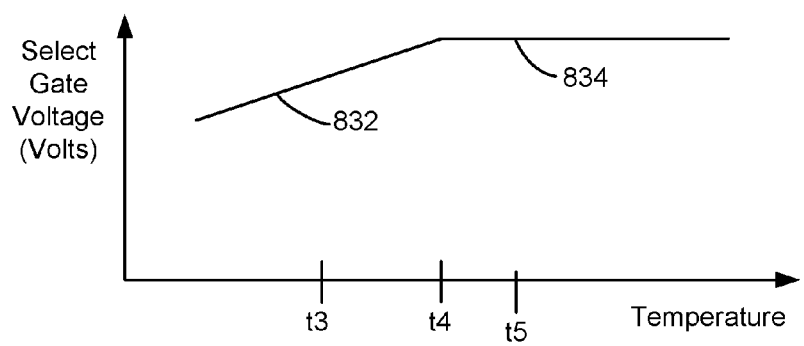
Figure 10C:
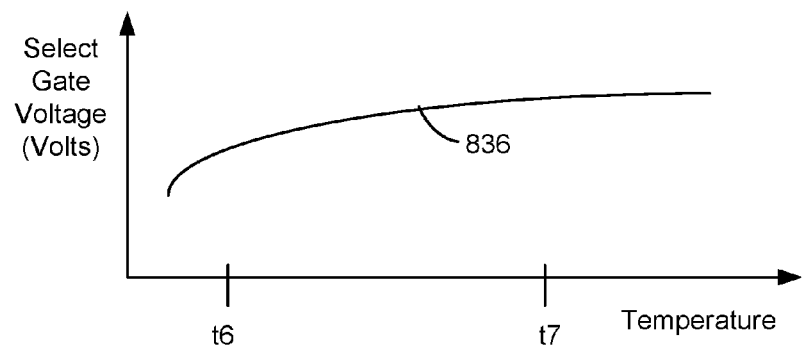

FIGS. 10A-10C shows various examples in which the magnitude of the voltage applied to the select gate depends on temperature. In each of these example, the magnitude of the select gate voltage is directly related to temperature, as the term "directly related" is used herein. These examples may be used for the various cases depicted in FIG. 9B-9D, but are not limited thereto. In one embodiment, the select gate voltage is a drain side select gate. In one embodiment, the select gate voltage is a source side select gate. When a two-sided erase is performed, the magnitude of the drain side select gate voltage is not required to be equal to the magnitude of the source side select gate voltage.

FIG. 10A depicts one example of a select gate voltage that has a magnitude that depends on temperature. In this example, below temperature t0, the select gate voltage has its smallest magnitude, v0. Between temperature t0 and t1, the select gate voltage has magnitude of v1. Between temperature t1 and t2, the select gate voltage has magnitude of v2. Above temperature t2, the select gate voltage that has its largest magnitude of v3. There could be more or fewer distinct voltage magnitudes. In one embodiment, there are just two distinct voltage magnitudes. In the example of FIG. 10A, within a given temperature range, the magnitude of the select gate voltage may be constant. However, note that there may be some variance due to non-ideal characteristics of the circuits that generate the select gate voltage.

Applying the scheme of FIG. 10A to FIG. 9B may result in four different sets of voltage levels, corresponding to the four temperature ranges in FIG. 10A. Applying the scheme of FIG. 10A to FIG. 9C may result in four different sets of voltage levels, corresponding to the four temperature ranges in FIG. 10A. For example, there may be a value for v0, v1, v2, and v3 for each erase iteration. However, the value for v0 (as well as v1, v2, and v3) may be different for each erase iteration. Applying the scheme of FIG. 10A to FIG. 9C may result in four different sets of voltage levels, corresponding to the four temperature ranges in FIG. 10A. In this case, the value for v0 may be the same for the first three erase iterations, and then increase. Similar reasoning applied to v1, v2, and v3.

It is not required that the magnitude of the select gate voltage be constant over a temperature range. FIG. 10B depicts another example of a select gate voltage that has a magnitude that depends on temperature. In this case, the magnitude has a non-zero slope below temperature t4. In this example, the slope of line 832 is positive. In other words, the magnitude of the select gate voltage increases with increasing temperature below temperature t4. This helps to create the strongest effect at lowest temperatures. FIG. 10B also shows line 834, which has a slope of zero. In other words, the magnitude of the select gate voltage does not change with temperature above temperature t4. Thus, there is not a direct relationship between the magnitude of the select gate voltage and temperature above t4. However, note that there is direct relationship between the magnitude of the select gate voltage between temperatures t3 and, for example, t5.

Applying the scheme of FIG. 10B to FIG. 9B may result in the set of voltage levels 951-958 being used when the temperature is at or above t4. Below t4, the voltage level can vary depending on temperature, as indicated by curve 832. Thus, the set of levels 921-928 may correspond to a temperature somewhere below t4, such as t3. Thus, there may be many more sets of levels, for various temperatures below t4.

Applying the scheme of FIG. 10B to FIG. 9C may result in the set of voltage levels 961-968 being used when the temperature is at or above t4. Below t4, the voltage level can vary depending on temperature, as indicated by curve 832. Thus, the set of levels 981-988 may correspond to a temperature somewhere below t4, such as t3. Thus, there may be many more sets of levels, for various temperatures below t4.

Applying the scheme of FIG. 10B to FIG. 9D may result in the set of voltage levels 971-978 being used when the temperature is at or above t4. Below t4, the voltage level can vary depending on temperature, as indicated by curve 832. Thus, the set of levels 991-998 may correspond to a temperature somewhere below t4, such as t3. Thus, there may be many more sets of levels, for various temperatures below t4.

The relationship between the magnitude of the select gate voltage and temperature can have many possibilities. FIG. 10C depicts one example in which the magnitude of the select gate voltage has a non-linear relationship with temperature. For example, curve 836 is non-linear. In this example, curve 836 is monotonically increasing. Note that the rate of increase (e.g., slope) is not required to be constant. The slope of curve 836 is greatest at lowest temperatures. This helps to create the strongest effect at lowest temperatures.

Applying the scheme of FIG. 10C to FIG. 9B may result in the set of voltage levels 951-958 being used when the temperature at t7. The set of levels 921-928 may correspond to a temperature at t6. Thus, there may be many more sets of levels, for various temperatures other than t6 or t7.

Applying the scheme of FIG. 10C to FIG. 9C may result in the set of voltage levels 961-968 being used when the temperature at t7. The set of levels 981-988 may correspond to a temperature at t6. Thus, there may be many more sets of levels, for various temperatures other than t6 or t7.

Applying the scheme of FIG. 10C to FIG. 9D may result in the set of voltage levels 971-978 being used when the temperature at t7. The set of levels 991-998 may correspond to a temperature at t6. Thus, there may be many more sets of levels, for various temperatures other than t6 or t7.

Note that in some embodiments, the direct relationship between the magnitude of the select gate voltage and temperature holds at least for lower temperatures. For example, when focusing exclusively in the temperature range above t4 in FIG. 10B, there is not a direct relationship between the magnitude of the select gate voltage and temperature. As another example, when focusing exclusively in the temperature range above t2 in FIG. 10A, there is not a direct relationship between the magnitude of the select gate voltage and temperature.

Although not depicted in any of FIGS. 10A-10C, it is possible at higher temperatures for the magnitude of the select gate voltage to be inversely related to temperature. For example, the slope of line 834 could become negative at some temperature above t5. However, the direct relationship between the magnitude of the select gate voltage and temperature will still hold below the temperature at which the slope of line 834 become negative. For example, the magnitude of the select gate voltage is lower at t3 than it is at t5.

Figure 10D:
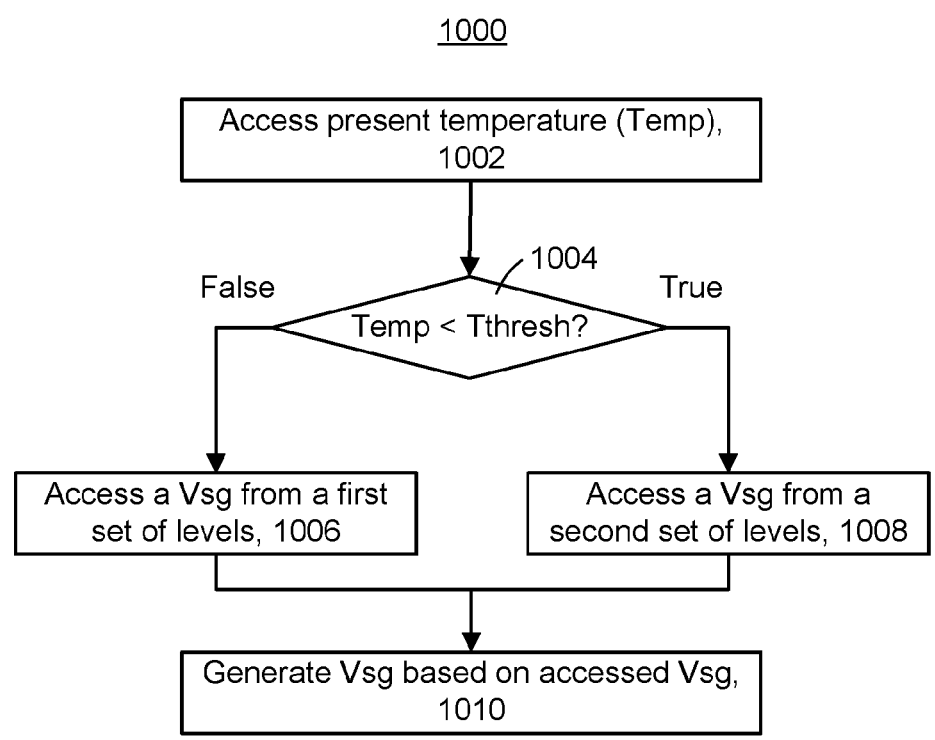
FIG. 10D is a flowchart of one embodiment of a process 1000 of generating a temperature dependent select gate voltage.

FIG. 10D is a flowchart of one embodiment of a process 1000 of generating a temperature dependent select gate voltage. In one embodiment, process 1000 is performed, at least in part, by control circuitry 110. In one embodiment, process 1000 is performed, at least in part, by controller 122. The process 1000 could be used in step 804 of process 800; however, step 804 is not limited to the technique in process 1000. In step 1002 a present temperature is accessed. In one embodiment, the temperature-sensing circuit 115 is used to determine the present temperature. In one embodiment, the temperature-sensing circuit 115 outputs a digital value that represents the present temperature.

Step 1004 includes a test of whether the present temperature is below a temperature threshold. The temperature threshold could be any temperature. As one example, the temperature threshold is 20 degrees Celsius. However, the temperature threshold could be greater than or less than 20 degrees Celsius.

If the present temperature is not below the temperature threshold, then a select gate voltage (Vsg) is accessed from a first set of voltage levels, in step 1006. In one embodiment, this is a default set of voltage levels. The examples of FIGS. 9B-9D could be used. For example, if the memory system 100 is using a scheme such as in FIG. 9B, then one of the levels in set 951-958 can be selected, depending on which erase loop is being performed. If the memory system 100 is using a scheme such as in FIG. 9C, then one of the levels in set 961-968 can be selected, depending on which erase loop is being performed. If the memory system 100 is using a scheme such as in FIG. 9D, then one of the levels in set 971-978 can be selected, depending on which erase loop is being performed.

If the present temperature is below the temperature threshold, then a select gate voltage (Vsg) is accessed from a second set of voltage levels, in step 1008. In one embodiment, this is a set of voltage levels to be used for colder temperatures. The examples of FIGS. 9B-9D could be used. For example, if the memory system 100 is using a scheme such as in FIG. 9B, then one of the levels in set 921-928 can be selected, depending on which erase loop is being performed. If the memory system 100 is using a scheme such as in FIG. 9C, then one of the levels in set 981-988 can be selected, depending on which erase loop is being performed. If the memory system 100 is using a scheme such as in FIG. 9D, then one of the levels in set 991-998 can be selected, depending on which erase loop is being performed.

In one embodiment, the various Vsg voltage levels for steps 1006 and 1008 are stored in a table in non-volatile storage somewhere in the memory system 100. The table could be in ROM 122a, storage region 113, storage device 126a, etc. In one embodiment, state machine 112 determines which Vsg to use by accessing a suitable value from a table in storage region 113 based on which erase loop is being performed. It is not required that a table driven approach be used. In another example, the processor 122c could calculate a Vsg using an equation. As one example, the processor 122c could calculate a Vsg based on an equation that represents line 832 in FIG. 10B, or curve 836 in FIG. 10C.

In step 1010 a select gate voltage (Vsg) is generated based on the accessed Vsg. In one embodiment, the power control module 116 generates the select gate voltage. The power control module 116 may do so in response to a control signal from, for example, state machine 112.

Note that many alternatives to process 1000 are possible. For example, rather than two sets of voltage levels, there may be three, four, etc. sets of levels corresponding to different temperatures ranges (see FIG. 10A for one example having four levels). Also, it is not required that a test be made whether the temperature is above or below a threshold temperature. For example, in the approach of FIG. 10C, the controller may determine a suitable magnitude for Vsg without a test for whether the temperature is above or below a threshold.

FIG. 11A is a flowchart of one embodiment of a process 1100 of applying erase conditions. Process 1100 is one embodiment of process 800. Process 1100 may be used in one iteration of one embodiment of step 706. Process 1100 may be used for a one-sided erase from the source side. Step 1102 includes applying a voltage to a drain side select gate and to a bit line associated with the string to keep the drain side select gate non-conductive. Thus, the bit line is not in communication with the string. GIDL current is not generated in the drain side select gate, in this embodiment.

Step 1104 includes applying an erase pulse to a source line associated with a string of non-volatile storage elements. In one embodiment, the erase pulse is applied to n-type source diffusion layer 611a (see FIG. 4). The erase pulse could be any erase pulse in a sequence, such as any erase pulse in the sequence 930 in FIG. 9A. Note that the erase pulses in FIG. 9A have two portions 940, 941. In one embodiment, step 1104 includes applying these two portions 940, 941.

Step 1106 includes generating a source side select gate voltage that has a magnitude that depends on temperature. In one embodiment, step 1106 is consistent with the example of FIG. 9B. Note that there may be more than two sets of voltage levels, as has been discussed above. In the example of FIG. 9B, the source side select gate voltage does not depend on which erase iteration is being performed. However, the magnitude of the source side select gate voltage does depend on temperature. Also note that regardless of which erase iteration is being performed, the erase pulse has a particular magnitude. Thus, note that for an erase pulse having a particular magnitude, the magnitude of the source side select gate voltage depends on temperature.

In one embodiment, step 1106 is consistent with the example of FIG. 9C. Note that there may be more than two set of voltage levels, as has been discussed above. In the example of FIG. 9C, the magnitude of the source side select gate voltage does depend on which erase iteration is being performed. Also, the magnitude of the side select gate voltage depends on temperature. Also note that regardless of which erase iteration is being performed, the magnitude of the source side select gate voltage depends on temperature. Also note that regardless of which erase iteration is being performed, the erase pulse has a particular magnitude. Thus, note that for an erase pulse having a particular magnitude, the magnitude of the source side select gate voltage depends on temperature.

In one embodiment, step 1106 is consistent with the example of FIG. 9D. Note that there may be more than two set of voltage levels, as has been discussed above. Note that regardless of which erase iteration is being performed, the magnitude of the source side select gate voltage depends on temperature. Also note that regardless of which erase iteration is being performed, the erase pulse has a particular magnitude. Thus, note that for an erase pulse having a particular magnitude, the magnitude of the source side select gate voltage depends on temperature.

Step 1108 includes applying the temperature dependent source side select gate voltage to the source side select gate while applying the erase pulse to the source line. As noted, in some embodiments, the erase pulse has two portions 940, 941. In one embodiment, the temperature dependent source side select gate voltage is applied when both portions 940, 941 of erase pulse are applied. Note that in this case the magnitude of portion 940 may depend on the magnitude of the temperature dependent source side select gate voltage. In one embodiment, the magnitude of portion 940 is the same as the magnitude of the temperature dependent source side select gate voltage. In one embodiment, the temperature dependent source side select gate voltage is applied when portion 941 is applied, but not when portion 940 is applied.

As a result of step 1108 the channel of the string may be charged. In one embodiment, the channel is charged to approximately the magnitude of the erase pulse. In one embodiment, applying the temperature dependent select gate voltage to a source side select gate while applying the erase pulse to a source line associated with the NAND string, wherein applying the temperature dependent select gate voltage to the source side select gate while applying the erase pulse to the source line generates a gate induced drain leakage (GIDL) current to charge the channel of the NAND string.

Step 1110 includes grounding word lines associated with the strings. As a result of this voltage and the channel potential, a strong electrical field may be generated across the memory cells. In one embodiment, holes in the channel combine with electrons in the charge storage region of the memory cells to lower the threshold voltage of the memory cells. Note that a non-zero voltage that is less than the magnitude of the erase pulse could be applied to the word lines instead of ground.

FIG. 11B is a flowchart of one embodiment of a process 1150 of applying erase conditions. Process 1150 is one embodiment of process 800. Process 1150 may be used in one iteration of one embodiment of step 706. Process 1150 is used for a one-sided erase from the drain side. Step 1152 includes applying a voltage to a source side select gate and to a source line associated with the string to keep the source side select gate non-conductive. Thus, the source line is not in communication with the string. GIDL current is not generated in the source side select gate, in this embodiment.

Step 1154 includes applying an erase pulse to a bit line associated with a string of non-volatile storage elements. In one embodiment, the erase pulse is applied to BL0 (see FIG. 4). The erase pulse could be any erase pulse in a sequence, such as the sequence in FIG. 9A. Note that the erase pulses in FIG. 9A have two portions 940, 941. In one embodiment, step 1104 includes applying these two portions 940, 941.

Step 1156 includes generating a drain side select gate voltage that has a magnitude that depends on temperature. In one embodiment, step 1156 is consistent with the example of FIG. 9B. Note that there may be more than two set of voltage levels, as has been discussed above. In the example of FIG. 9B, the drain side select gate voltage does not depend on which erase iteration is being performed. However, the magnitude of the drain side select gate voltage does depend on temperature. Also note that regardless of which erase iteration is being performed, the erase pulse has a particular magnitude. Thus, note that for an erase pulse having a particular magnitude, the magnitude of the drain side select gate voltage depends on temperature.

In one embodiment, step 1156 is consistent with the example of FIG. 9C. Note that there may be more than two set of voltage levels, as has been discussed above. In the example of FIG. 9C, the magnitude of the drain side select gate voltage does depend on which erase iteration is being performed. Also, the magnitude of the drain select gate voltage depends on temperature. Also note that regardless of which erase iteration is being performed, the magnitude of the drain side select gate voltage depends on temperature. Also note that regardless of which erase iteration is being performed, the erase pulse has a particular magnitude. Thus, note that for an erase pulse having a particular magnitude, the magnitude of the drain side select gate voltage depends on temperature.

In one embodiment, step 1156 is consistent with the example of FIG. 9D. Note that there may be more than two set of voltage levels, as has been discussed above. Note that regardless of which erase iteration is being performed, the magnitude of the drain side select gate voltage depends on temperature. Also note that regardless of which erase iteration is being performed, the erase pulse has a particular magnitude. Thus, note that for an erase pulse having a particular magnitude, the magnitude of the drain side select gate voltage depends on temperature.

Step 1158 includes applying the temperature dependent drain side select gate voltage to the drain side select gate while applying the erase pulse to the bit line. As noted, in some embodiments, the erase pulse has two portions 940, 941. In one embodiment, the temperature dependent drain side select gate voltage is applied when both portions 940, 941 of erase pulse are applied. Note that in this case the magnitude of portion 940 may depend on the magnitude of the temperature dependent drain side select gate voltage. In one embodiment, the magnitude of portion 940 is the same as the magnitude of the temperature dependent drain side select gate voltage. In one embodiment, the temperature dependent drain side select gate voltage is applied when portion 941 is applied, but not when portion 940 is applied.

As a result of step 1158 the channel of the string may be charged. In one embodiment, the channel is charged to approximately the magnitude of the erase pulse. In one embodiment, applying the temperature dependent select gate voltage to the drain side select gate while applying the erase pulse to the bit line generates a gate induced drain leakage (GIDL) current to charge the channel of the NAND string.

Step 1160 includes grounding word lines associated with the strings. As a result of this voltage and the channel potential, a strong electrical field may be generated across the memory cells. In one embodiment, holes in the channel combine with electrons in the charge storage region of the memory cells to lower the threshold voltage of the memory cells. Note that a non-zero voltage that is less than the magnitude of the erase pulse could be applied to the word lines instead of ground.

Process 1100 and process 1150 may be combined in a two-sided erase. FIG. 11C is a flowchart depicting one embodiment of a process 1180 of a two-sided erase. Process 1180 is one embodiment of process 800. Process 1180 may be used in one iteration of one embodiment of step 706.

Step 1182 includes applying a first erase pulse to the bit line and a second erase pulse to the source line. These two erase pulses may have the same magnitude and duration.

Step 1184 includes generating a temperature dependent source side select gate voltage and generating a temperature dependent drain side select gate voltage. These two voltages are not required to have the same magnitude. Step 1184 may include various aspects discussed in process 1100 and 1150 respectively.

Step 1186 includes applying the temperature dependent source side select gate voltage to a source side select gate while applying the erase pulse to the source line, and applying the temperature dependent drain side select gate voltage to a drain side select gate while applying the erase pulse to the bit line. As a result the channel of the string may be charged. In one embodiment, the channel is charged to approximately the magnitude of the erase pulses (which may be the same as each other).

Step 1188 includes grounding word lines associated with the strings. As a result of this word line voltage and the channel potential, a strong electrical field may be generated across the memory cells. In one embodiment, holes in the channel combine with electrons in the charge storage region of the memory cells to lower the threshold voltage of the memory cells. Note that a non-zero voltage that is less than the magnitude of the erase pulse could be applied to the word lines instead of ground.

In one embodiment, the duration of the erase pulse applied to a bit line and/or a source line associated with a string of memory cells depends on temperature. In one embodiment, the duration is inversely related to temperature. By "inversely related", it is meant that as temperature drops the duration of the erase pulse increases for at least two temperatures.

Figure 12A:
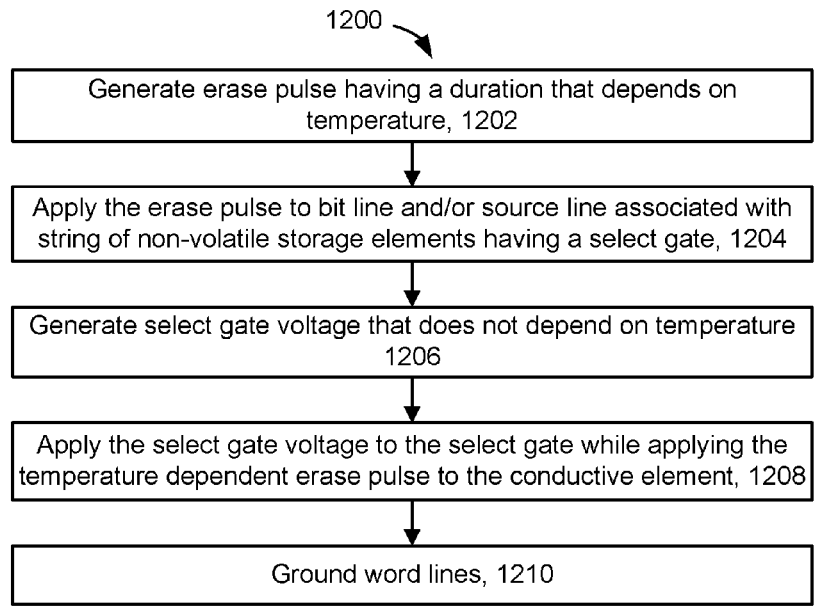
FIG. 12A is a flowchart of one embodiment of a process 1200 of a portion of an erase operation of a string of memory cells.

FIG. 12A is a flowchart of one embodiment of a process 1200 of a portion of an erase operation of a string of memory cells. Process 1200 is one embodiment of applying erase conditions (see step 706, FIG. 7). Process 1200 may be used for a one-sided or a two-sided erase.

In step 1202, an erase pulse having a duration that depends on temperature is generated. In one embodiment, the duration inversely relates to temperature. FIGS. 13A-13E, to be discussed below, are examples of erase pulses having a duration that depends on temperature.

In step 1204, the erase pulse is applied to a bit line and/or a source line associated with the string of memory cells. In one embodiment, an erase pulse having a duration that depends on temperature is applied to the bit line but not the source line. In one embodiment, an erase pulse having a duration that depends on temperature is applied to the source line but not the bit line. In one embodiment, an erase pulse having a duration that depends on temperature is applied to both the source line and the bit line.

Step 1206 includes generating a select gate voltage that does not depend on temperature. In the event that step 1204 applies the erase pulse to the bit line, step 1206 may include generating a select gate voltage for a drain side select gate. In the event that step 1204 applies the erase pulse to the source line, step 1206 may include generating a select gate voltage for a source side select gate. Step 1206 may include generating a select gate voltage gate voltage having a suitable magnitude to result in GIDL current in the select gate to which it is applied.

Step 1208 includes applying the select gate voltage(s) to the drain and/or source select gates. In one embodiment, the temperature dependent erase pulse is applied to the bit line and a GILD current is generated in the drain side select gate. In one embodiment, the temperature dependent erase pulse is applied to the source line and a GILD current is generated in the source side select gate. In one embodiment, a temperature dependent erase pulse is applied to both the bit line and the source line, and a GILD current is generated in both the drain side select gate and the source side select gate.

Step 1210 includes grounding word lines. As a result of this word line voltage and the channel potential, a strong electrical field may be generated across the memory cells. In one embodiment, holes in the channel combine with electrons in the charge storage region of the memory cells to lower the threshold voltage of the memory cells. Note that a non-zero voltage that is less than the magnitude of the erase pulse could be applied to the word lines instead of ground.

Figure 12B:
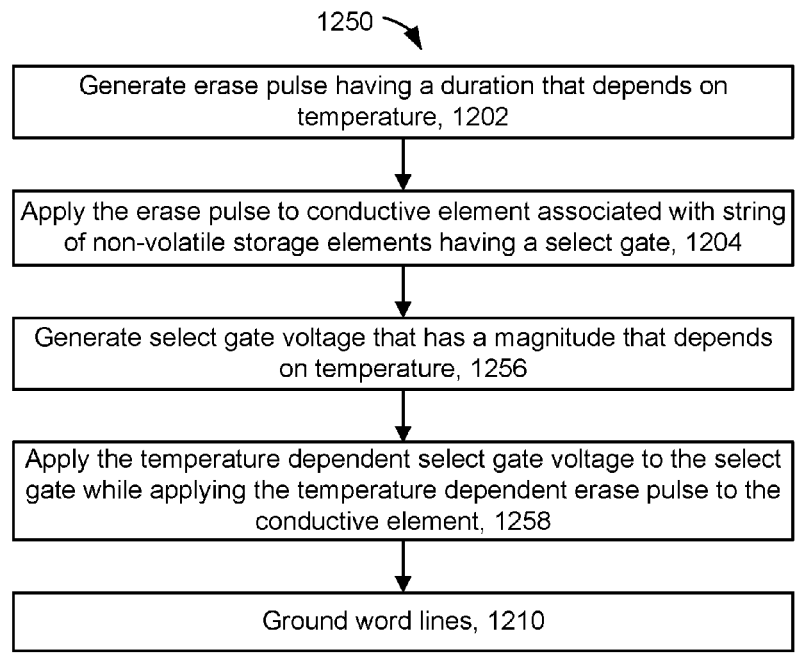
FIG. 12B is a flowchart of one embodiment of a process 1250 of a portion of an erase operation of a string of memory cells.

FIG. 12B is a flowchart of one embodiment of a process 1250 of a portion of an erase operation of a string of memory cells. Process 1250 is one embodiment of applying erase conditions (see step 706, FIG. 7). Process 1250 may be used for a one-sided or a two-sided erase. Process 1250 differs from process 1200 in that the magnitude of at least one of the select gate voltages also depends on temperature.

Steps 1202-1204 are similar to steps 1202-1204 of process 1200.

Step 1256 includes generating a select gate voltage having a magnitude that depends on temperature. In the event that step 1204 applies the erase pulse to the bit line, step 1256 may include generating a temperature dependent select gate voltage for a drain side select gate. In the event that step 1254 applies the erase pulse to the source line, step 1256 may include generating a temperature dependent select gate voltage for a source side select gate. Step 1256 may include generating a select gate voltage gate voltage having a suitable magnitude to result in GIDL current in the select gate to which it is applied.

Step 1258 includes applying the temperature dependent select gate voltage(s) to the drain and/or source select gates. In one embodiment, the temperature dependent erase pulse is applied to the bit line and temperature dependent select gate voltage applied to the drain side select gate. In one embodiment, the temperature dependent erase pulse is applied to the source line and the temperature dependent select gate voltage applied to the source side select gate. In one embodiment, a temperature dependent erase pulse is applied to both the bit line and the source line, and a temperature dependent select gate voltage is applied to both the drain side select gate and the source side select gate.

Steps 1256 and 1258 may be similar to various embodiments in processes 700, 800, 1100, 1150, and 1180. Thus, the temperature dependent select gate voltages may have characteristics such as, but not limited to, FIGS. 9B-9D, and 10A-10C.

Step 1210 includes grounding word lines. As a result of this word line voltage and the channel potential, a strong electrical field may be generated across the memory cells. In one embodiment, holes in the channel combine with electrons in the charge storage region of the memory cells to lower the threshold voltage of the memory cells. Note that a non-zero voltage that is less than the magnitude of the erase pulse could be applied to the word lines instead of ground.

Figure 13A:
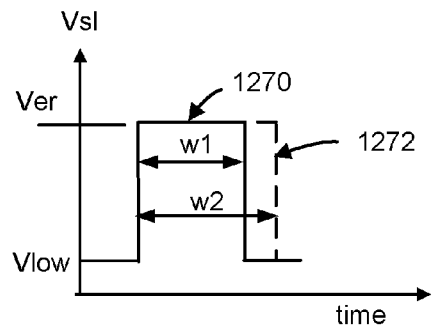
FIG. 13A depicts one embodiment of a temperature dependent erase pulse that may be applied to a source line.

FIG. 13A depicts one embodiment of a temperature dependent erase pulse that may be applied to a source line. Pulse 1270 has a duration of w1, and pulse 1272 has a duration of w2. In one embodiment, the longer duration pulse is applied when the temperature is colder. Thus, the duration may be inversely related to temperature.

Figure 13B:
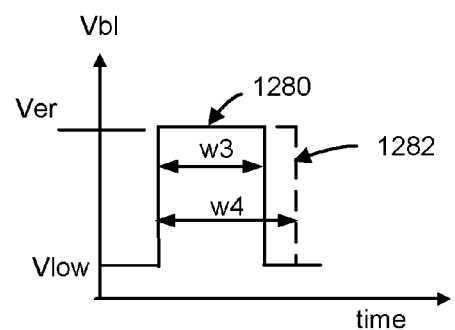
FIG. 13B depicts one embodiment of a temperature dependent erase pulse that may be applied to a bit line.

FIG. 13B depicts one embodiment of a temperature dependent erase pulse that may be applied to a bit line. Pulse 1280 has a duration of w3, and pulse 1282 has a duration of w4. In one embodiment, the longer duration pulse is applied when the temperature is colder. Thus, the duration may be inversely related to temperature.

As discussed with respect to the example of FIG. 9A, the erase pulse may have a first portion 940 and a second portion 941. In one embodiment, the erase pulses in FIGS. 13A and 13B correspond to the second portion 941. Thus Vlow may correspond to Vsg in FIG. 9A. However, the erase pulse is not required to have two portions. In this case, Vlow may be 0V, as one example.

Figure 13C:
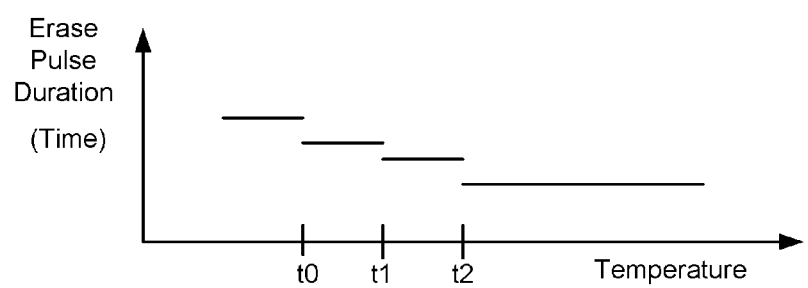
FIGS. 13C-13E depict several examples of erase pulse duration versus temperature.
Figure 13D:
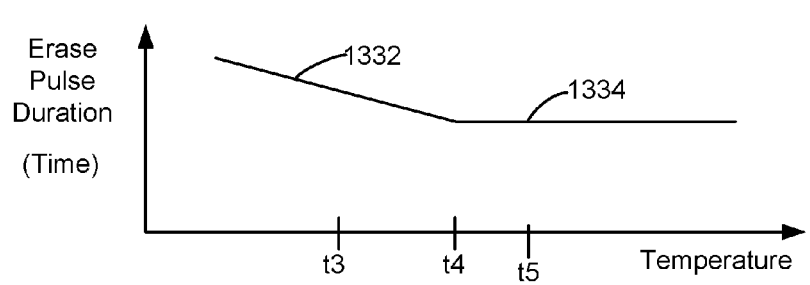
Figure 13E:
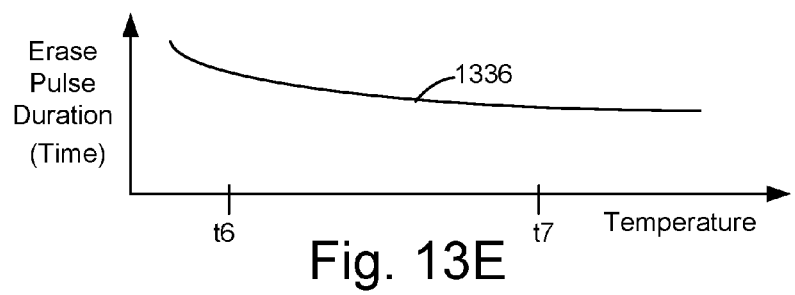

FIGS. 13C-13E depict several examples of erase pulse duration versus temperature. These examples may be applied to process 1200 or 1250, but are not limited thereto. In each of FIGS. 13A-13E, the duration of the erase pulse depends on temperature. In these examples, the duration of the erase pulse is inversely related to temperature. The inverse relationship hold at least for temperatures below some temperature threshold, in one embodiment.

The same temperatures (t0-t7) have been used in FIGS. 13A-13E as were used in FIGS. 10A-10C. Also, the basic shapes of the relationships in FIGS. 13A-13E are similar to the ones in FIGS. 10A-10C, but are inverted. This is for ease of discussion, but is not required.

In the example of FIG. 13C, below temperature t0, the erase pulse duration is longest. Between temperature t0 and t1, the erase pulse duration is slightly shorter. Between temperature t1 and t2, the erase pulse duration is still shorter. Above temperature t2, the erase pulse duration is shortest.

There could be more or fewer distinct erase pulse durations. In one embodiment, there are just two distinct erase pulse durations. In the example of FIG. 13C, within a given temperature range, the erase pulse duration may be constant. However, note that there may be some variance due to non-ideal characteristics of the circuits that generate the erase pulse duration.

It is not required that the erase pulse duration be constant over a temperature range. FIG. 13D depicts another example of an erase pulse duration that depends on temperature. In this case, the erase pulse duration has a non-zero slope below temperature t4. In this example, the slope of line 1332 is negative. In other words, the erase pulse duration decreases with increasing temperature below temperature t4. This helps to create the strongest erase at lowest temperatures. FIG. 13D also shows line 1334, which has a slope of zero. In other words, the erase pulse duration does not change with temperature above temperature t4. Thus, there is not an inverse relationship between the erase pulse duration and temperature above t4. However, note that there is an inverse relationship between the erase pulse duration between temperatures t3 and, for example, t5.

The relationship between the erase pulse duration and temperature can have many possibilities. FIG. 13E depicts one example in which the erase pulse duration has a non-linear relationship with temperature. For example, curve 1336 is non-linear. In this example, curve 1336 is monotonically decreasing. Note that the rate of decrease (e.g., slope) is not required to be constant. The slope of curve 1336 is greatest (in absolute value) at lowest temperatures. This helps to create the strongest erase at lowest temperatures.

As noted above, an erase operation can involve multiple loops in which the magnitude of the erase voltage is raised from one loop to the next. In one embodiment, the magnitude of the erase pulse in the first loop depends on temperature. This can help to speed the erase process. Referring to FIG. 9A, in one embodiment, EV0 is skipped when the temperature is below a first temperature threshold. In one embodiment, EV0 is skipped when the temperature is below the first temperature threshold, and both EV0 and EV1 are skipped when the temperature is below a second temperature threshold that is a colder temperature than the first temperature threshold.

Having the magnitude of the erase pulse in the first loop depend on temperature may be combined with a temperature dependent magnitude for a select gate as has been described with respect to, for example processes 700, 800, 1100, 1150, and 1180. However, the having the magnitude of the erase pulse in the first loop depend on temperature may be used with a select gate voltage that does not depend on temperature.

Having the magnitude of the erase pulse in the first loop depend on temperature may be combined with a temperature dependent width of the erase pulse as has been described with respect to, for example, process 1200. However, the having the magnitude of the erase pulse in the first loop depend on temperature may be used with a select gate voltage that does not depend on temperature.

Having the magnitude of the erase pulse in the first loop depend on temperature may be combined with both a temperature dependent width of the erase pulse and a temperature dependent magnitude for a select gate as has been described with respect to, for example, process 1250.

Figure 14:
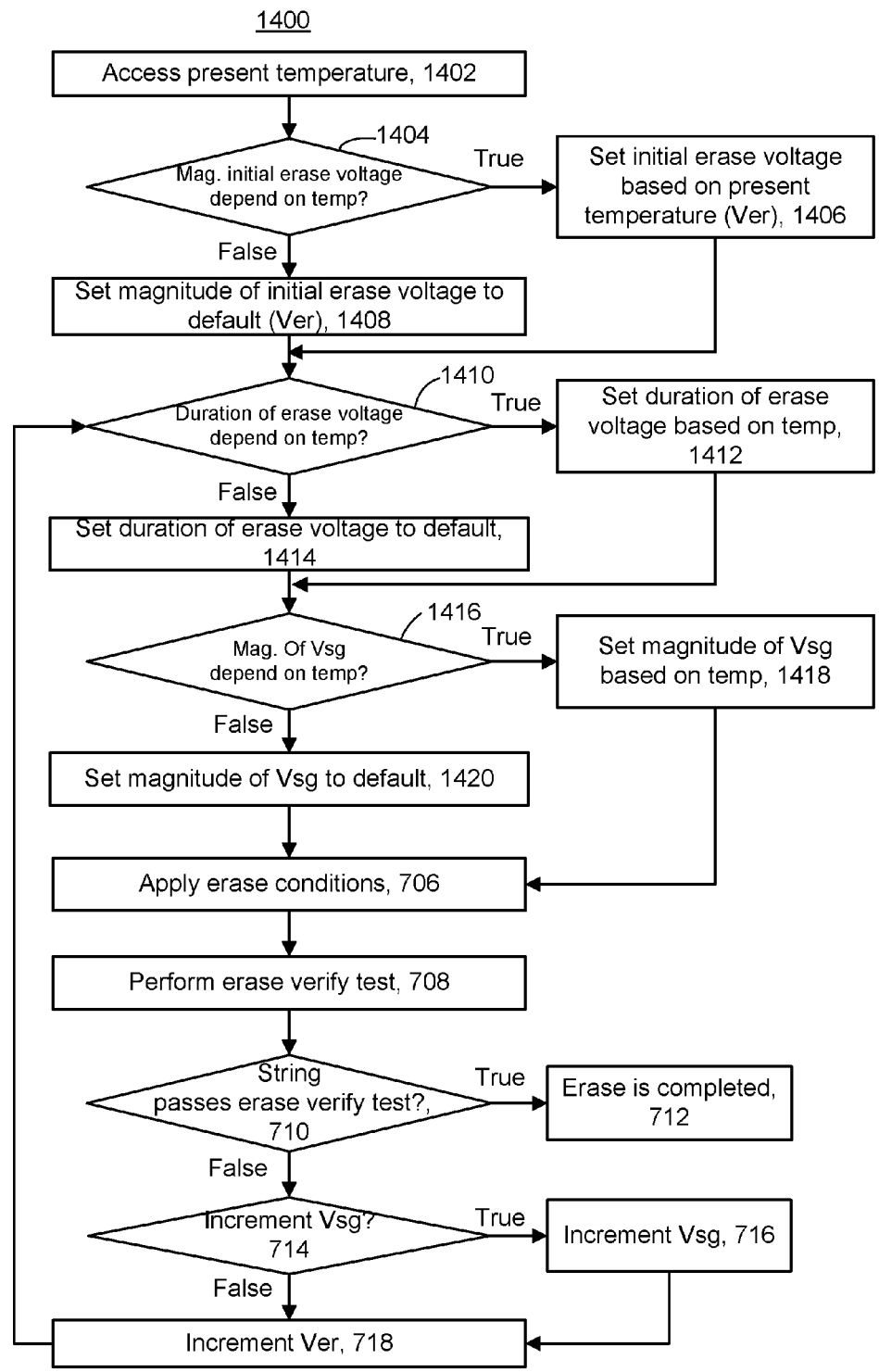
FIG. 14 is a flowchart of one embodiment of an erase procedure 1400.

FIG. 14 is a flowchart of one embodiment of an erase procedure 1400. The erase procedure 1400 is performed on a string of memory cells. The string of memory cells may be associated with a conductive element such as a bit line or source line. The string of memory cells has a select gate adjacent to the conductive element. For example, the string of memory cells may have a drain side select gate at the same end of a NAND string as a bit line and/or a source side select gate at the same end of the NAND string as a source line.

In one embodiment, process 1400 is performed by a control circuit. In one embodiment, process 1400 is performed on a NAND string of memory cells. The string of memory cells is a NAND string in a three-dimensional memory array, in one embodiment. The string is a vertically oriented NAND string in a three-dimensional memory array, in one embodiment. Note that the steps of process 1400 are not necessarily performed in the depicted order.

Step 1402 includes accessing a present temperature. In one embodiment, processor 122c accesses the present temperature from temperature sensing circuit 115. In one embodiment, state machine 112 accesses the present temperature from temperature sensing circuit 115.

Step 1404 includes a determination whether the magnitude of the initial erase pulse is to depend on temperature. If so, the magnitude of the initial erase voltage is established based on the present temperature, in step 1406. In one embodiment, there is an inverse relationship between the magnitude of the initial erase voltage and temperature. Referring to FIG. 9A, in one embodiment, EV0 is skipped when the temperature is below a first temperature threshold. In one embodiment, EV0 is skipped when the temperature is below the first temperature threshold, and both EV0 and EV1 are skipped when the temperature is below a second temperature threshold that is a colder temperature than the first temperature threshold.

If it is determined that the magnitude of the initial erase voltage is not to depend on temperature (step 1404=False), then the magnitude of the initial erase voltage is set to a default value in step 1408. For example, the first erase pulse in FIG. 9A may be used.

1410 includes a determination whether the duration the erase pulse is to depend on temperature. Note that this may be for the duration of all of the erase pulses in the various erase loops. However, another option is to only have the duration of the erase pulse depend on temperature for some of the erase loops.

Based on the determination of step 1410, either the duration the erase pulse is set based on the present temperature (step 1412) or the duration the erase pulse is set to a default length (step 1414). Setting the duration the erase pulse based on the present temperature can be performed in accordance with process 1200, 1250, the examples of FIG. 13A-13E, but is not limited thereto.

1416 includes a determination whether the magnitude of the select gate voltage is to depend on temperature. Note that this refers to the select gate associated with the erase pulse. Note that this may for the select gate voltage for all of just some erase loops.

Based on the determination of step 1416, either the magnitude of the select gate voltage is set based on the present temperature (step 1418) or the duration the magnitude of the select gate voltage is set to a default magnitude (step 1420). Setting the magnitude of the select gate voltage based on the present temperature can be performed in accordance with process 800, 1100, 1150, 1180, the examples of FIGS. 9A-9D, 10A-10C, but is not limited thereto.

The process 1400 then performs steps 706-718, as has been described with respect to FIG. 7. After step 718, the process returns to step 1410.

Note that many combinations of the results of steps 1404, 1410, and 1416 are possible. In one embodiment, steps 1404, 1410, and 1416 all true. In one embodiment, step 1404 is false and steps 1410 and 1416 are true. In one embodiment, step 1404 is false, step 1410 is false and step 1416 is true. In one embodiment, step 1404 is true, step 1410 is false and step 1416 is true. In one embodiment, step 1404 is false, step 1410 is true and step 1416 is false. In one embodiment, step 1404 is true, step 1410 is true and step 1416 is false. In one embodiment, step 1404 is true, step 1410 is false and step 1416 is false.

One embodiment disclosed herein includes an apparatus comprises a conductive element; a string comprising non-volatile storage elements, a first select gate at a first end of the string, and a second select gate at a second end of the string; and a control circuit coupled to the first select gate and to the conductive element. The string having a channel that extends between the first end and the second end. The first select gate is coupled to the conductive element. The control circuit is coupled to the first select gate and to the conductive element. The control circuit is configured to apply an erase voltage to the conductive element. The control circuit is configured to generate a select gate voltage that has a magnitude that depends on temperature. The control circuit is configured to apply the select gate voltage to a control terminal the first select gate while the control circuit applies the erase voltage to the conductive element.

One embodiment disclosed herein includes a method comprising: applying an erase pulse to a source line or a bit line that is connected to a first terminal of a first select gate at a first end of a vertically oriented NAND string of non-volatile storage elements in a three-dimensional memory array. The NAND string has a second select gate at a second end of the NAND string and a channel that extends between the first end and the second end. The method also comprises generating a select gate voltage that has a magnitude that depends on temperature. The method also comprises applying the temperature dependent select gate voltage to the first select gate while applying the erase pulse to the conductive element.

One embodiment disclosed herein includes a non-volatile storage system, comprising: a semiconductor substrate having a major surface that extends horizontally; and a three-dimensional memory array above the semiconductor substrate. The three-dimensional memory array comprises a plurality of bit lines; a plurality of vertically oriented NAND strings comprising non-volatile storage elements; a plurality of word lines associated with the non-volatile storage elements; and a source line between the plurality of vertically oriented NAND strings and the semiconductor substrate. Each of the NAND strings has a source side select gate at a first end of the NAND string, a drain side select gate at a second end of the NAND string, and a channel having a first end coupled to one of the bit lines and a second end coupled to the source line. The non-volatile storage system further comprises means for applying an erase pulse to the source line; means for applying a voltage having a magnitude less than a magnitude of the erase pulse to the word lines while applying the erase pulse to the source line; means for generating a temperature dependent source side select gate voltage; and means for applying the temperature dependent select gate voltage to the source side select gate while applying the erase pulse to the source line to generate a gate induced drain leakage (GIDL) current to pass the erase pulse to the channels of the NAND strings.

In one embodiment, the means for applying an erase pulse to the source line comprises one or more of state machine 112, power control 116, read write circuits 128, and/or controller 122. The means for applying an erase pulse to the source line could comprise other hardware and/or software.

In one embodiment, the means for applying a voltage having a magnitude less than a magnitude of the erase pulse to the word lines while applying the erase pulse to the source line comprises one or more of state machine 112, power control 116, read write circuits 128, and/or controller 122. The means for applying a voltage having a magnitude less than a magnitude of the erase pulse to the word lines while applying the erase pulse to the source line could comprise other hardware and/or software.

In one embodiment, the means for generating a temperature dependent source side select gate voltage comprises one or more of state machine 112, power control 116, temperature sensing circuit 115, and/or controller 122. The means for generating a temperature dependent source side select gate voltage could comprise other hardware and/or software.

In one embodiment, the means for applying the temperature dependent select gate voltage to the source side select gate while applying the erase pulse to the source line to generate a gate induced drain leakage (GIDL) current to pass the erase pulse to the channels of the NAND strings comprises one or more of state machine 112, power control 116, read/write circuits 128, temperature sensing circuit 115, and/or controller 122. The means for applying the temperature dependent select gate voltage to the source side select gate while applying the erase pulse to the source line to generate a gate induced drain leakage (GIDL) current to pass the erase pulse to the channels of the NAND strings could comprise other hardware and/or software.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:
1. An apparatus, comprising:
a conductive element;
a string comprising non-volatile storage elements, a first select gate at a first end of the string, and a second select gate at a second end of the string, the string having a channel that extends between the first end and the second end, the first select gate coupled to the conductive element; and
a control circuit coupled to the first select gate and to the conductive element, the control circuit configured to apply an erase voltage to the conductive element, the control circuit configured to generate a select gate voltage that has a magnitude that depends on temperature, the control circuit configured to apply the select gate voltage to a control terminal the first select gate while the control circuit applies the erase voltage to the conductive element.

2. The apparatus of claim 1, wherein the control circuit is configured to cause the magnitude of the select gate voltage to be lower in response to lower temperatures.

3. The apparatus of claim 1, wherein the control circuit is configured to increase the difference between the magnitude of the erase voltage and the magnitude of the select gate voltage in response to lower temperatures.

4. The apparatus of claim 1, wherein for a particular magnitude erase voltage the control circuit is configured to generate the select gate voltage having a first voltage in response to the temperature being below a threshold temperature and a second voltage in response to the temperature being above the threshold temperature, wherein the first voltage is less than the second voltage.

5. The apparatus of claim 1, wherein the control circuit is configured to apply a sequence of increasing erase pulses to the conductive element during different loops of an erase procedure, wherein the erase voltage is one of the sequence of the increasing erase pulses for a particular loop of the erase procedure, wherein the select gate voltage is one of a sequence of select gate voltages that are used for different loops of the erase procedure, wherein the control circuit is configured to generate the select gate voltage for the particular loop having a first voltage in response to the temperature being below a threshold temperature and a second voltage in response to the temperature being above the threshold temperature, wherein the first voltage is less than the second voltage.

6. The apparatus of claim 1, wherein the string is a vertically oriented NAND string in a three-dimensional memory array.

7. The apparatus of claim 1, wherein the conductive element comprises a bit line, wherein the channel at the first end of each the string is coupled to the bit line, wherein the control circuit is configured to apply the erase voltage to the bit line.

8. The apparatus of claim 1, wherein the conductive element comprises a source line, wherein the channel at the first end of the string is coupled to the source line, wherein the control circuit is configured to apply the erase voltage to the source line.

9. The apparatus of claim 1, wherein the control circuit is further configured to increase a duration of the erase voltage applied to the conductive element in response to colder temperatures.

10. The apparatus of claim 1, wherein the erase voltage is a first erase voltage in a series of erase voltages that increase in magnitude, wherein the control circuit is further configured to establish the magnitude of the first erase voltage in the series based on temperature, wherein the control circuit is further configured to increase the magnitude of the first erase voltage in the series in response to the temperature being colder.

11. A method comprising:
applying an erase pulse to a source line or a bit line that is connected to a first terminal of a first select gate at a first end of a vertically oriented NAND string of non-volatile storage elements in a three-dimensional memory array, the NAND string having a second select gate at a second end of the NAND string, and a channel that extends between the first end and the second end;
generating a select gate voltage that has a magnitude that depends on temperature; and
applying the temperature dependent select gate voltage to the first select gate while applying the erase pulse to the source line or the bit line.

12. The method of claim 11, wherein applying the temperature dependent select gate voltage to the first select gate while applying the erase pulse to the source line or the bit line comprises:
applying the temperature dependent select gate voltage to a drain side select gate while applying the erase pulse to the bit line, wherein applying the temperature dependent select gate voltage to the drain side select gate while applying the erase pulse to the bit line generates a gate induced drain leakage (GIDL) current to charge the channel of the NAND string.

13. The method of claim 11, wherein applying the temperature dependent select gate voltage to the first select gate while applying the erase pulse to the source line or the bit line comprises:
applying the temperature dependent select gate voltage to a source side select gate while applying the erase pulse to the source line, wherein applying the temperature dependent select gate voltage to the source side select gate while applying the erase pulse to the source line generates a gate induced drain leakage (GIDL) current to charge the channel of the NAND string.

14. The method of claim 11, further comprising:
adjusting a duration of the erase pulse applied to the bit line or the source line in response to temperature.

15. The method of claim 11, further comprising:
establishing a magnitude of the erase pulse based on temperature;
testing whether the non-volatile storage elements are erased after passing the erase pulse to the channel; and
applying one or more additional erase pulses to the bit line or the source line while applying a corresponding one or more additional temperature dependent select gate voltages to the select gate to pass the one or more additional erase pulses to the channel until the non-volatile storage elements are erased.

16. A non-volatile storage system, comprising:
a semiconductor substrate having a major surface that extends horizontally;
a three-dimensional memory array above the semiconductor substrate, the three-dimensional memory array comprising:
a plurality of bit lines;
a plurality of vertically oriented NAND strings comprising non-volatile storage elements;
a plurality of word lines associated with the non-volatile storage elements;
a source line between the plurality of vertically oriented NAND strings and the semiconductor substrate;
wherein each of the NAND strings has a source side select gate at a first end of the NAND string, a drain side select gate at a second end of the NAND string, and a channel having a first end coupled to one of the bit lines and a second end coupled to the source line; and
means for applying an erase pulse to the source line;
means for applying a voltage having a magnitude less than a magnitude of the erase pulse to the word lines while applying the erase pulse to the source line;
means for generating a temperature dependent source side select gate voltage; and
means for applying the temperature dependent select gate voltage to the source side select gate while applying the erase pulse to the source line to generate a gate induced drain leakage (GIDL) current to pass the erase pulse to the channels of the NAND strings.

17. The non-volatile storage system of claim 16, wherein the means for generating the temperature dependent source side select gate voltage comprises:
means for detecting a present temperature; and
means for controlling a magnitude of the temperature dependent source side select gate voltage to be directly related to the present temperature.

18. The non-volatile storage system of claim 16, further comprising:
means for controlling a duration of the erase pulse applied to the source line in response to temperature.

19. The non-volatile storage system of claim 16, further comprising:
means for applying an erase pulse to the plurality of bit lines;
means for generating a temperature dependent drain side select gate voltage; and
means for applying the temperature dependent drain side select gate voltage to the drain side select gates while applying the erase pulse to the plurality of bit lines to generate GIDL current to pass the erase pulse from the bit lines to the channels of the NAND strings.

20. The non-volatile storage system of claim 19, further comprising:
means for controlling a duration of the erase pulse applied to the plurality of bit lines in response to temperature.

* * * * *